United States Patent
Yoshimura et al.

(10) Patent No.: US 8,269,594 B2
(45) Date of Patent: Sep. 18, 2012

(54) INSULATED TRANSFORMERS, AND POWER CONVERTING DEVICE

(75) Inventors: Hiroyuki Yoshimura, Yokohama (JP); Katsunori Ueno, Matsumoto (JP); Masaharu Edo, Tokorozawa (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 81 days.

(21) Appl. No.: 12/081,695

(22) Filed: Apr. 18, 2008

(65) Prior Publication Data

US 2009/0046489 A1    Feb. 19, 2009

(30) Foreign Application Priority Data

Apr. 19, 2007   (JP) ................... 2007-110810

(51) Int. Cl.
    H01F 5/00      (2006.01)
    H01F 27/28     (2006.01)
    H01L 27/08     (2006.01)
(52) U.S. Cl. .................. 336/200; 336/232; 257/531
(58) Field of Classification Search .............. 336/200, 336/232; 257/531
    See application file for complete search history.

(56) References Cited

U.S. PATENT DOCUMENTS

| | | | | |
|---|---|---|---|---|
| 4,785,345 A * | 11/1988 | Rawls et al. | ................. | 257/531 |
| 5,214,392 A * | 5/1993 | Kobayashi et al. | ............. | 330/10 |
| 5,231,054 A * | 7/1993 | Kosugi | .......................... | 438/648 |
| 5,598,135 A * | 1/1997 | Maeda et al. | ................. | 336/200 |
| 5,716,713 A * | 2/1998 | Zsamboky et al. | ........... | 428/457 |
| 5,896,078 A * | 4/1999 | Hayakawa et al. | ........... | 336/200 |
| 5,994,739 A * | 11/1999 | Nakagawa et al. | ........... | 257/350 |
| 6,307,457 B1 * | 10/2001 | Wissink et al. | ................ | 336/200 |
| 6,501,364 B1 * | 12/2002 | Hui et al. | ....................... | 336/200 |
| RE38,082 E * | 4/2003 | Vlahu | ............................. | 336/69 |
| 6,618,929 B2 * | 9/2003 | Kitamura | ..................... | 29/602.1 |
| 6,759,740 B2 * | 7/2004 | Onitani et al. | ................. | 257/705 |
| 6,873,240 B2 * | 3/2005 | Nakatsu et al. | ................ | 336/200 |
| 7,193,837 B1 * | 3/2007 | Epstein | ......................... | 361/220 |
| 2002/0121957 A1 * | 9/2002 | Takashima et al. | ........... | 336/200 |
| 2003/0042571 A1 * | 3/2003 | Chen et al. | .................... | 257/531 |
| 2004/0227608 A1 | 11/2004 | Nakatani et al. | | |
| 2005/0230837 A1 | 10/2005 | Taghizadeh-Kaschani | | |
| 2006/0022287 A1 * | 2/2006 | Itoi et al. | ........................ | 257/421 |
| 2006/0028313 A1 * | 2/2006 | Strzalkowski et al. | ........ | 336/223 |
| 2006/0033552 A1 | 2/2006 | Ishikawa et al. | | |
| 2006/0049483 A1 * | 3/2006 | Lin et al. | ........................ | 257/531 |
| 2006/0158908 A1 * | 7/2006 | Usui | .............................. | 363/15 |

FOREIGN PATENT DOCUMENTS

| | | |
|---|---|---|
| JP | 3-97386 U | 10/1991 |
| JP | 05-291063 A | 11/1993 |
| JP | 05-343245 A | 12/1993 |
| JP | 06-349664 A | 12/1994 |
| JP | 2002-057037 A | 2/2002 |
| JP | 2002-233140 A | 8/2002 |

(Continued)

*Primary Examiner* — Mohamad Musleh
*Assistant Examiner* — Tsz Chan
(74) *Attorney, Agent, or Firm* — Rabin & Berdo, P.C.

(57) ABSTRACT

An insulated transformer, which can suppress aging deterioration and can reduce the influence of noise caused by external magnetic flux, while improving reliability and environmental resistance, and can send and receive signals while electrically insulating a low-voltage side and a high-voltage side. A secondary coil is formed on a semiconductor substrate, and a primary coil is formed on one face of a glass substrate. The primary coil fixes the glass substrate formed on one face onto the semiconductor substrate through the other face of the glass substrate by an adhesive layer.

3 Claims, 24 Drawing Sheets

FOREIGN PATENT DOCUMENTS

| | | |
|---|---|---|
| JP | 2005-005685 | 1/2005 |
| JP | 2005-184891 A | 7/2005 |
| JP | 2005-224925 A | 8/2005 |
| JP | 2005-279219 A | 10/2005 |
| JP | 2005-310959 | 11/2005 |
| JP | 2006-054933 A | 2/2006 |

* cited by examiner

INSULATED TRANSFORMERS, AND POWER CONVERTING DEVICE

BACKGROUND OF THE INVENTION

1. Field of the Invention

The present invention relates to an insulated transformer and a power converting device, and is appropriately applied to a method using a glass substrate for insulating the primary winding and the secondary winding of the insulated transformer.

2. Background Art

In order to enhance the efficiency of, and to spare the energy consumption of, a modern vehicular device, a step-up/step-down converter and an inverter are mounted on a drive system for an electric motor to generate driving power. FIG. 9 is a block diagram showing a schematic arrangement of a vehicle driving system using a step-up/step-down converter according to the background art. In FIG. 9, the vehicle driving system is equipped with a power source 1101 for feeding electric power to a step-up/step-down converter 1102, for stepping a voltage up/down. An inverter 1103 of the system converts the voltage outputted from the step-up/step-down converter 1102 into a three-phase voltage. An electric motor 1104 drives the vehicle. The power source 1101 can be constituted of either a feed voltage from an aerial line or a battery connected in series.

When a vehicle is driven, the step-up/step-down converter 1102 steps up the voltage (e.g., 280 V) of the power source 1101 to a voltage (e.g., 750 V) suited for driving the electric motor 1104, and feeds the stepped-up voltage to the inverter 1103. By controlling the ON/OFF state of the switching element, the voltage stepped-up by the step-up/step-down converter 1102 is converted into a three-phase voltage so that the speed of the vehicle can be changed by feeding the electric current to the individual phases of the electric motor 1104, thereby to control the switching frequency.

When a vehicle brakes are applied, the inverter 1103 controls the ON/OFF state of the switching element in synchronism with the voltages arising in the individual phases of the electric motor 1104, so that it performs rectification to make a conversion into a DC voltage, thereby feeding the DC voltage to the step-up/step-down converter 1102. The step-up/step-down converter 1102 is enabled to perform power regeneration by dropping the voltage (e.g., 750 V) generated from the electric motor 1104, to the voltage (e.g., 280 V) of the power source 1101.

FIG. 10 is a block diagram schematically showing a constitution of the step-up/step-down converter of FIG. 9. In FIG. 10, the step-up/step-down converter 1102 is equipped with an inductor L for storing the energy; a condenser C thereof stores an electric charge, and switching elements SW1 and SW2 turn ON and OFF the electric current flowing into the inverter 1103. Control circuits 1111 and 1112 individually generate control signals to instruct turning the switching elements SW1 and SW2 ON and OFF.

The switching elements SW1 and SW2 are connected in series, and a node between SW1 and SW2 is connected with the power source 1101 through the inductor L. The switching element SW1 is equipped an IGBT (Insulated Gate Bipolar Transistor) 1105 for performing switching in accordance with control signals from the control circuit 1111, and a flywheel diode D1 for feeding the electric current in the direction opposed to that which the electric current flowing to the IGBT 1105 is connected in parallel with the IGBT 1105.

The switching element SW2 is equipped with an IGBT 1106 for performing switching actions in accordance with control signals from the control circuit 1112. A flywheel diode D2 feeding the electric current in the direction opposed to that of the electric current flowing to the IGBT 1106 is connected in parallel with the IGBT 1106. The collector of the IGBT 1106 is connected to both the condenser C and the inverter 1103.

FIG. 11 is a diagram showing a waveform of an electric current flowing through the inductor L of FIG. 10 in the stepping-up operation. In stepping-up, as shown in FIG. 11, when the IGBT 1105 of the switching element SW1 is turned ON (conductive), an electric current I flows through the IGBT 1105 to the inductor L so that an energy of $LI^2/2$ is stored in the inductor L. Next, when the IGBT 1105 of the switching element SW1 is turned OFF (nonconductive), the electric current flows to the flywheel diode D2 of the switching element SW2, so that the energy stored in the inductor L is fed to the condenser C.

In the stepping-down action, when the IGBT 1106 of the switching element SW2 is turned ON (conductive), the electric current I flows to the inductor L through the IGBT 1106, so that an energy of $LI^2/2$ is stored in the inductor L. Next, when the IGBT 1106 of the switching element SW2 is turned OFF (nonconductive), the electric current flows to the flywheel diode D1 of the switching element SW1, so that the energy stored in the inductor L is regenerated to the power source 1101.

By changing the ON time (ON Duty) of the switching element, the step-up/step-down voltage can be adjusted so that its rough value can be determined from the following formula (1):

$$V_L/V_H = \text{ON Duty (\%)} \qquad (1).$$

In formula (I) $V_L$ indicates the power source voltage, $V_H$ indicates the voltage after step-up/step-down, and ON Duty indicates the ratio of a conduction period to the switching period of the switching elements SW1 and SW2.

As a matter of fact, the load and the power source voltage $V_L$ fluctuate. Therefore, the voltage $V_H$ after step-up/step-down is monitored, and the ON time (ON Duty) of the switching elements SW1 and SW2 is controlled such that the step-up/step-down voltage $V_H$ may reach the target value. The control circuits 1111 and 1112 to be grounded to the body casing are on the low-voltage side, and the arm to be connected with the switching elements SW1 and SW2 is on the high-voltage side. In order that the human body may not be exposed to dangers even in the event of breakage of the switching elements SW1 and SW2, the signal transfer is made using a photocoupler to insulate the control circuits 1111 and 1112 electrically.

FIG. 12 is a block diagram schematically showing a constitution of an intelligent power module for the step-up/step-down converter of the background art. In FIG. 12, an intelligent power module for the step-up/step-down converter is equipped with switching elements SWU and SWD for turning ON/OFF an electric current flowing into loads, and a control circuit 1 for generating control signals to indicate the ON/OFF status of the switching elements SWU and SWD. The control circuit 1 can be constituted of a CPU 4 or a logical IC, or a system LSI having the logic IC and the CPU mounted thereon.

The switching elements SWU and SWD are connected in series so that they act for an upper arm 2 and a lower arm 3, respectively. The switching element SWU is equipped with an IGBT 6 for performing a switching action on the basis of a gate signal SU4. A flywheel diode DU1 is connected in parallel with the IGBT 6 for feeding an electric current inversely of the electric current flowing through the IGBT 6.

The chip having the IGBT 6 is equipped with a temperature sensor using the VF change of a diode DU2 due to the temperature change of the chip as its measurement principle, and a current sensor for detecting a main circuit current by shunting the emitter current of the IGBT 6 through resistors RU1 and RU2.

The switching element SWD is equipped with an IGBT 5 for performing a switching action on the basis of a gate signal SD4. A flywheel diode DD1 is connected in parallel with the IGBT 5 for feeding an electric current inversely of the electric current flowing through the IGBT 5. The chip having the IGBT 5 is equipped with a temperature sensor and a current sensor. The temperature sensor uses the VF change of a diode DD2 due to the temperature change of the chip as its measurement principle. The current sensor detects a main circuit current by shunting the emitter current of the IGBT 5 through resistors RD1 and RD2.

The upper arm 2 is equipped with a gate driver IC 8 having a protecting function to generate the gate signal SU4 for driving the control terminal of the IGBT 6, while monitoring an overheating detection signal SU6 from the temperature sensor and an overcurrent detection signal SU5 from the current sensor. The upper arm also includes an analog PWM converter CU for generating a PWM signal corresponding to the temperature of the IGBT 6. The lower arm 3 is equipped with a gate driver IC 7 having a protecting function to generate the gate signal SD4 for driving the control terminal of the IGBT 5, while monitoring an overheating detection signal SD6 from the temperature sensor and an overcurrent detection signal SD5 from the current sensor. The lower arm also includes an analog PWM converter CD for generating a PWM signal corresponding to the temperature of the IGBT 5.

Photocouplers FU1 to FU3 and FD1 to FD3 are individually interposed between the side of the control circuit 1 to be grounded to the body casing and the upper arm 2 and the lower arm 3 to take a high voltage. These photo couplers are used to transfer the signals in the control circuit 1, while electrically insulating the side of the upper arm 2 and the side of the lower arm 3. On the side of the upper arm 2, specifically, a gate driver PWM signal SU1, as outputted from the CPU 4, is inputted through the photocoupler FU1 to the gate driver IC 8 with the protecting function. An alarm signal SU2, as outputted from the gate driver IC 8 with the protecting function, is inputted to the CPU 4 through photocoupler FU2. An IGBT chip temperature PWM signal SU3, as outputted from the analog PWM converter CU, is inputted to the CPU 4 through the photocoupler FU3.

On the side of the lower arm 3, a gate driver PWM signal SD1, as outputted from the CPU 4, is inputted through the photocoupler FD1 to the gate driver IC 7 with the protecting function. An alarm signal SD2, as outputted from the gate driver IC 7 with the protecting function, is inputted to the CPU 4 through the photocoupler FD2. An IGBT chip temperature PWM signal SD3, as outputted from the analog PWM converter CD, is inputted to the CPU 4 through the photocoupler FD3.

FIG. 13 is a block diagram showing a schematic constitution of a peripheral circuit of the photocoupler. In FIG. 13, a photocoupler 2008 is equipped with an infrared light emitting diode 2003 for emitting an infrared light with a forward current If. A light receiving diode 2004 of the photocoupler receives the emitted infrared light, and a bipolar transistor 2005 performs a current amplifying action by using a photocurrent generated in the light receiving diode 2004, as its base current. The infrared light emitting diode 2003 has its cathode connected with a field effect type transistor 2001 through a resistor 2002, and the bipolar transistor 2005 has its collector connected with a power voltage Vcc2 through a resistor 2006. An output signal Vout, as outputted through the collector of the bipolar transistor 2005, is inputted to an IGBT drive IC 2007.

When a signal SP is inputted to the gate of the field effect type transistor 2001, the forward current If flows to the infrared light emitting diode 2003 so that the infrared light is emitted. The infrared light emitted from the infrared light emitting diode 2003 is received by the light receiving diode 2004 so that a photocurrent according to the infrared light flows to the base of the bipolar transistor 2005. When the photocurrent flows to the base of the bipolar transistor 2005, a collector current Ic flows to the bipolar transistor 2005. When the collector current Ic flows to the resistor 2006 connected at its one end with the power voltage Vcc2, the change in the voltage at the other end of the resistor 2006 is inputted as the output signal Vout to the IGBT drive IC 2007.

The input/output characteristics of the single photocoupler 2008 can be defined by a current transfer ratio (CTR), i.e., Ic/If. When the circuit is designed using the photocoupler 2008, the following points have to be considered: (1) the temperature characteristics of a current amplification factor hfe of the bipolar transistor 2005; (2) the lifetime deterioration of the light emitting efficiency of the infrared light emitting diode 2003; and (3) the dispersion of the CTR.

FIG. 14 is a diagram showing the temperature characteristics of the current transfer efficiency of the photocoupler. In FIG. 14, the current transfer efficiency of the photocoupler 2008 becomes is reduced as the temperature becomes is reduced. This is caused by the temperature characteristics of the current amplification factor hfe of the bipolar transistor 2005. FIG. 15 is a diagram showing deterioration due to age characteristics of the current transfer efficiency of the photocoupler. In FIG. 15, the CTR of the photocoupler 2008 drops in dependence upon the forward current, the environmental temperature and the accumulated usage time of the light emitting diode 2003. The drop of the CTR appears prominently when the continuous usage time of the photocoupler 2008 exceeds 1,000 hours.

FIG. 16 is a diagram showing the dispersion of the current transfer efficiency of the photocoupler. In FIG. 16, the current transfer efficiency of the photocoupler is highly dispersed. This is caused by the dispersion of the light emitting efficiency of the light emitting diode 2003 or the current amplification factor hfe of the bipolar transistor 2005. Where the photocoupler is used as insulation transfer means in the intelligent power module for the step-up/step-down converter of FIG. 12, the circuit design has to be made considering the aforementioned points. Continuous use over more than 10 years is difficult in the hot atmosphere of a vehicle or an industrial device. An insulated transformer may be used as the transfer signal insulating means instead of the photocoupler. A micro-transformer that may be used as this insulated transformer, which can be drastically miniaturized by utilizing MEMS (Micro Electro Mechanical Systems) techniques, has been produced by several makers.

FIG. 17A is a sectional view showing a schematic arrangement of the insulated transformer of the background art, and FIG. 17B is a top plan view showing the schematic arrangement of the insulated transformer of FIG. 17A. In FIG. 17, an outgoing wiring layer 12 is buried in a semiconductor substrate 11, and a primary coil pattern 14 is formed over the semiconductor substrate 11. The primary coil pattern 14 is connected with the outgoing wiring layer 12 through an outgoing portion 13. A flattened film 15 is formed over the primary coil pattern 14, and a secondary coil pattern 17 is formed over the flattened film 15, which is covered with a protecting film 18. An opening 19 is formed in the protecting film 18 for exposing the center of the secondary coil pattern 17 to the outside. The outgoing wiring from the secondary coil pattern 17 can be made by connecting a bonding wire to the center of the secondary coil pattern 17 through the opening 19. The primary coil pattern 14 and the secondary coil pattern 17 can have a winding width of 5 to 10 µm, a thickness of 4 to 5 µm and the outermost winding diameter of 500 µm, for example.

FIG. 18 and FIG. 19 present sectional views showing methods for manufacturing the insulated transformer of the background art. In FIG. 18A, an impurity such as As, P or B is selectively injected into the semiconductor substrate 51, thereby forming such an outgoing diffusion layer 52 in the semiconductor substrate 51 as is led out from the center of the primary coil pattern 55a. The material for the semiconductor substrate 51 can be selected from Si, Ge, SiGe, SiC, SiSn, PbS, GaAs, InP, GaP, GaN or ZnSe.

Next, the insulating layer 53 is formed by the plasma CVD method or the like on the semiconductor substrate 51 having the outgoing diffusion layer 52 formed therein, as shown in FIG. 18B. The material for the insulating layer 53 can be exemplified by a silicon oxide film or a silicon nitride film. Next, as shown in FIG. 18C, by using the photolithography technique, a resist pattern 54, which has an opening 54a formed to correspond to the outgoing portion from the center of the primary coil pattern 55a, is formed over the insulating layer 53. Next, as shown in FIG. 18D, the insulating layer 53 is etched by using the resist pattern 54 having the opening 54a as the mask, so as to form such an opening 53a in the insulating layer 53 to correspond to the outgoing portion from the center of the primary coil pattern 55a. Next, as shown in FIG. 18E, the resist pattern 54 is peeled off from the insulating layer 53 by means of chemicals.

Next, as shown in FIG. 18F, a conductive film 55 is formed over the insulating layer 53 by a sputtering or vapor deposition method. The material for the conductive film 55 can be exemplified by a metal such as Al or Cu. Next, as shown in FIG. 18G, a resist pattern 56 corresponding to the primary coil pattern 55a is formed by using the photolithography technique. Next, as shown in FIG. 18H, the primary coil pattern 55a is formed over the insulating layer 53 by etching the conductive film 55, using the resist pattern 56 as a mask. Then, as shown in FIG. 18I, the resist pattern 56 is peeled off from the primary coil pattern 55a by means of chemicals.

Next, as shown in FIG. 18J, a flattened film 57 is formed by the plasma CVD method or the like over the insulating layer 53 having the primary coil pattern 55a. The material for the flattened film 57 can be exemplified by the silicon oxide film or the silicon nitride film. Then, as shown in FIG. 18K, the flattened film 57 is flattened and cleared of its surface roughness by an oblique etching method or CMP (Chemical Mechanical Polishing) method. Next, as shown in FIG. 18L, by using the photolithography technique, a resist pattern 58, which has an opening 58a formed to correspond to the wiring outgoing portion of the outer end of the secondary coil pattern 60a, is formed over the flattened film 57.

Next, as shown in FIG. 19A, the flattened film 57 is etched by using the resist pattern 58 having the opening 58a as a mask, forming an opening 57a corresponding to the wiring outgoing portion of the outer end of the secondary coil pattern 60a over the flattened film 57. Next, as shown in FIG. 19B, the resist pattern 58 is peeled off from the flattened film 57 by means of chemicals. Next, as shown in FIG. 19C, a separating layer 59 for the primary coil pattern 55a and the secondary coil pattern 60a is formed over the flattened film 57. The method for forming the separating layer 59 can be exemplified by the method for forming a polyimide layer over the flattened film 57 by a spin coating. Alternatively, the separating layer 59 may also be formed by forming a silicon oxide film over the flattened film 57 by the sputtering method.

Next, as shown in FIG. 19D, a conductive film 60 is formed over the separating layer 59 by the sputtering or vapor deposition method. The material for the conductive film 60 can be exemplified by a metal such as Al or Cu. Next, as shown in FIG. 19E, a resist pattern 61 corresponding to the secondary coil pattern 60a is formed by using the photolithography technique. Next, as shown in FIG. 19F, the conductive film 60 is etched by using the resist pattern 61 as a mask, thereby forming the secondary coil pattern 60a over the separating layer 59. Next, as shown in FIG. 19G, the resist pattern 61 is peeled off from the secondary coil pattern 60a by means of chemicals.

Next, as shown in FIG. 19H, a protecting film 62 is formed over the separating layer 59 having the secondary coil pattern 60a, by the plasma CVD method. The material for the protecting film 62 can be exemplified by a silicon oxide film or a silicon nitride film. The protecting film 62 is patterned by using the photolithography technique and the etching technique, to expose the end portions and the central portions of the secondary coil pattern 60a to the outside.

In JP 2005-5685 A (corresponding to U.S. Pat. No. 6,927, 664), for example, a method is disclosed for reducing the occupied area of a transformer element formed of a first wiring layer and a second wiring layer. When one of the first wiring layer and the second wiring layer is projected from one of the vertically upward direction and the vertically downward direction, a contour projected has a symmetrical shape with reference to a predetermined reference plane. The portion in which the projected contour might otherwise interlink over one of the first wiring layer and the second wiring layer is made not to interlink by using the first wiring layer and the second wiring layer.

In US 2005/0230837 A1, for example, an air-core transformer is disclosed that is equipped with first and second coils enclosed in the horizontal direction by a protecting ring. In JP 2005-310959 A, for example, a method is disclosed in which a laminated transformer is constituted from a magnetic sheet having coil conductors individually formed on its surface, and a magnetic sheet having glass insulating layers individually formed on its surface, so that the insulating withstand voltage between the coils is raised without increasing the height of the parts, while suppressing the reduction in coupling between the coils of the laminated transformer.

SUMMARY OF THE INVENTION

In the insulated transformer manufacturing method of FIG. 18 and FIG. 19, however, the method of forming the polyimide layer as the separating layer 59 by a spin coating is limited to have the film thickness of the separating layer 59 to 20 µm or less to maintain the flatness of the surface. The method of forming the silicon oxide film as the separating layer 59 by sputtering is limited to have the film thickness of the separating layer 59 to 10 µm, while considering the heterogeneity and the filming rate of the surface due to the thermal stress at the time of filming.

In vehicles and industrial devices it is required to have an ESD withstand of 15 to 30 kV, corresponding to the static electricity potential of a human body. When the micro-transformer shown in FIG. 19 is packaged as an IC by combining it with the primary-side circuit and the secondary-side circuit, a voltage of 15 to 30 kV is applied to the separating layer 59. A dielectric breakdown occurs at 8 to 11 kV for the polyimide layer having a film thickness of 20 μm, and at about 7 kV for the silicon oxide film having a film thickness of 10 μm. This raises a problem in that the separating layer 59 is dielectrically broken down when the voltage of 15 to 30 kV is applied to the separating layer 59. Hence, an object of the invention is to provide an insulated transformer and a power converting device that can suppress deterioration due to aging and can reduce the influence of noise caused by external magnetic flux, while having improved reliability and environmental resistance, and which can send and receive signals while electrically insulating a low-voltage side from a high-voltage side.

In order to solve the aforementioned problems, according to a first aspect of the invention, an insulated transformer is provided comprising: a primary winding and a secondary winding arranged to face or oppose each other; and a glass substrate or a ceramic substrate for insulating and separating the primary winding from the secondary winding. As a result, the spacing between the primary winding and the secondary winding of the insulated transformer can be retained at several tens μm or more without causing any deterioration in the flatness and the homogeneity of the surface upon which the primary winding and the secondary winding are formed. As a result, the ESD withstand of 15 to 30 kV can be retained while miniaturizing the insulated transformer by a fine working technique, and the influence of noise caused by external magnetic flux can be reduced while improving reliability and environmental resistance. In addition, signals can be sent and received while electrically insulating a low-voltage side from a high-voltage side.

In an insulated transformer according to a second aspect of the invention the primary and secondary windings are laminated on each other through the glass substrate or the ceramic substrate. As a result, the primary winding and the secondary winding can be formed by semiconductor processing techniques, so that the influences of noise caused by external magnetic flux can be reduced while enhancing the coupling coefficient between the primary winding and the secondary winding.

According to a third aspect of the invention, there is provided an insulated transformer comprising: a semiconductor substrate having one of a primary winding and a secondary winding formed thereon; and a glass substrate or a ceramic substrate having the other of the primary winding and the secondary winding formed on one of its faces and fixed to the semiconductor substrate through the other face. As a result, the insulated transformer can be integrated with the semiconductor substrate while retaining the spacing between the primary winding and the secondary winding of the insulated transformer at several tens μm or more. The ESD withstand of 15 to 30 kV can be retained to reduce the size of the signal transmission circuit.

In an insulated transformer according to a fourth aspect of the invention, the semiconductor substrate and the glass substrate or the ceramic substrate are fixed together through an adhesive film. As a result, the insulated transformer can be integrated with the semiconductor substrate, even in a case where the primary winding or the secondary winding of the insulated transformer is formed over the glass substrate or the ceramic substrate.

In an insulated transformer according to a fifth aspect of the invention, the semiconductor substrate and the glass substrate or the ceramic substrate are fixed together through an electrostatic junction. As a result, the insulated transformer can be integrated with the semiconductor substrate, even in a case where the primary winding or the secondary winding of the insulated transformer is formed over the glass substrate or the ceramic substrate.

According to a sixth aspect of the invention, an insulated transformer is provided comprising: a glass substrate or a ceramic substrate having one of a primary winding and a secondary winding formed on one of its faces and having the other of the primary winding and the secondary winding formed on its other face; and a semiconductor substrate having a wiring pattern formed to have a region coextensive with the positions of the leading end and the trailing end of the primary winding or the positions of the leading end and the trailing end of the secondary winding, and fixing the glass substrate or the ceramic substrate having the primary winding and the secondary winding.

As a result, the primary winding and the secondary winding of the insulated transformer can be arranged in an overlapping manner over the circuit pattern formed on the semiconductor substrate, while retaining the spacing between the primary winding and the secondary winding of the insulated transformer at several tens of μm or more. As a result, the insulated transformer can be integrated over the semiconductor substrate, while reducing the space for forming the primary winding and the secondary winding of the insulated transformer on the semiconductor substrate, so that the ESD withstand of 15 to 30 kV can be retained to reduce the size of the signal transmission circuit.

In an insulated transformer according to a seventh aspect of the invention, the insulated transformer is formed by a fine working technique. As a result, it is possible to reduce the winding diameters of the primary winding and the secondary winding, and to reduce the spacing between the primary winding and the secondary winding. As a result, the influences of noise can be reduced while enhancing the coupling coefficient between the primary winding and the secondary winding, even in a case where the external magnetic flux interlinks with the primary winding and the secondary winding, thereby improving the S/N ratio.

In an insulated transformer according to a eighth aspect of the invention, the material for the glass substrate is a non-alkali component. As a result, even in a case where a high voltage is applied to the glass substrate, the alkali ion components can be prevented from migrating in the glass substrate, thereby suppressing the deterioration of the insulation of the glass substrate.

According to a ninth aspect of the invention, a power converting device is provided comprising: a pair of switching elements connected in series with each other for acting individually for an upper arm and a lower arm and for conducting and blocking an electric current flowing into a load; a control circuit for generating a control signal to control turning the switching elements ON and OFF; a drive circuit for driving a control terminal of the switching element based on the control signal; and an insulated transformer having a primary winding and a secondary winding arranged to face each other so that the control circuit and the drive circuit may be insulated, and having the primary winding and the secondary winding insulated and separated from each other by a glass substrate or a ceramic substrate.

As a result, the ESD withstand of 15 to 30 kV can be retained while miniaturizing the insulated transformer by the fine working technique, and the influence of noise caused by an external magnetic flux can be reduced while retaining the reliability of the insulated transformer. The signals can be sent and received while electrically insulating the low-voltage side and the high-voltage side. As a result, a photocoupler need not be used, so that environmental resistance can be improved while suppressing deterioration due to age.

According to the invention, as has been described hereinbefore, the spacing between the primary winding and the secondary winding of the insulated transformer can be retained to several tens μm or more while miniaturizing the insulated transformer by the micromachining technique. Thus, it is possible to reduce the influence of noise caused by the external magnetic flux while improving reliability and environmental resistance, and to send and receive signals while electrically insulating the low-voltage side and the high-voltage side.

DESCRIPTION OF THE PREFERRED EMBODIMENTS

Figure 1:
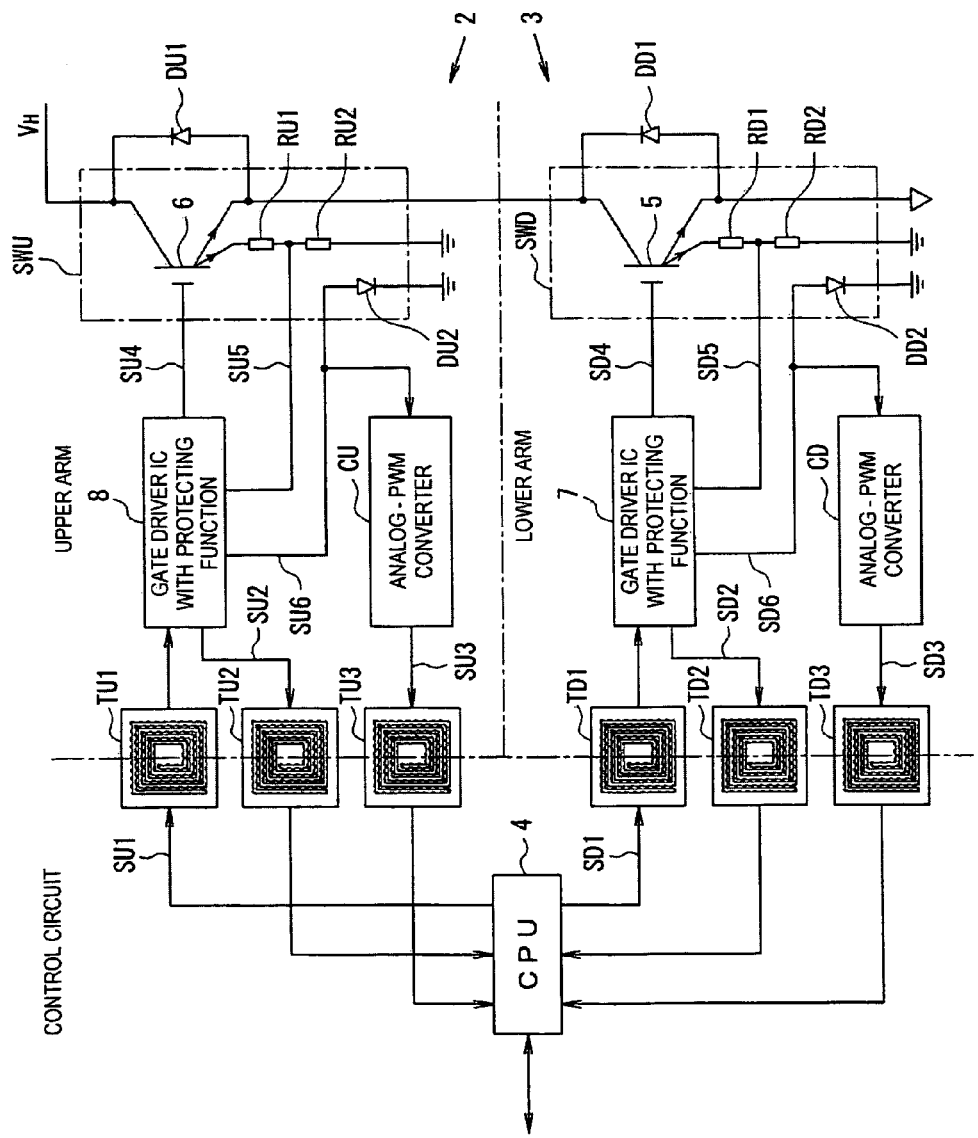
FIG. 1 is a block diagram showing an intelligent power module for a step-up/step-down converter in which an insulated transformer according to one embodiment of the invention is employed.

In the following description, insulated transformers according to embodiments of the invention are described with reference to the accompanying drawings. FIG. 1 is a block diagram showing an intelligent power module (IPM) for a step-up/step-down converter, in which a power electronics device according to one embodiment of the invention is employed. In FIG. 1, an intelligent power module for the step-up/step-down converter is equipped with switching elements SWU and SWD for turning an electric current flowing into loads ON/OFF, and a control circuit 1 for generating control signals to indicate the ON/OFF status of the switching elements SWU and SWD. The control circuit 1 can be constituted by a CPU 4 or a logical IC, or a system LSI having the logic IC and the CPU mounted thereon.

The switching elements SWU and SWD are connected in series so that they act for an upper arm 2 and a lower arm 3, respectively. The switching element SWU is equipped with an IGBT 6 for performing a switching action on the basis of a gate signal SU4. A flywheel diode DU1 for feeding an electric current inversely to the electric current flowing through the IGBT 6 is connected in parallel with the IGBT 6. The chip having the IGBT 6 is equipped with a temperature sensor using as its measurement principle the VF change of a diode DU2 due to the temperature change of the chip, and a current sensor for detecting a main circuit current by shunting the emitter current of the IGBT 6 through resistors RU1 and RU2.

The switching element SWD is equipped with an IGBT 5 for performing a switching action on the basis of a gate signal SD4. A flywheel diode DD1 is connected in parallel with the IGBT 5 for feeding an electric current inversely to the electric current flowing through the IGBT 5. The chip having the IGBT 5 is equipped with a temperature sensor using as its measurement principle the VF change of a diode DD2 due to the temperature change of the chip, and a current sensor for detecting a main circuit current by shunting the emitter current of the IGBT 5 through resistors RD1 and RD2.

The upper arm 2 is equipped with: a gate driver IC 8 having a protecting function to generate the gate signal SU4 for driving the control terminal of the IGBT 6, while monitoring an overheating detection signal SU6 from the temperature sensor and an overcurrent detecting signal SU5 from the current sensor; and an analog PWM converter CU for generating a PWM signal corresponding to the temperature of the IGBT 6. The gate driver IC 8 with the protecting function can be equipped with a self-diagnosing circuit for generating the status signals of the switching elements SWD and SWU, and the self-diagnosing circuit can generate the status signals of the switching elements SWD and SWU.

The lower arm 3 is equipped with: a gate driver IC 7 having a protecting function to generate the gate signal SD4 for driving the control terminal of the IGBT 5, while monitoring an overheating detection signal SD6 from the temperature sensor and an overcurrent detecting signal SD5 from the current sensor; and an analog PWM converter CD for generating a PWM signal corresponding to the temperature of the IGBT 5. Between the side of the control circuit 1 to be grounded to the body casing, and the upper arm 2 and the lower arm 3 to take a high voltage, air-core type insulated transformers TU1 to TU3 and TD1 to TD3 are individually interposed, which are used in the control circuit 1 to transfer the signals while electrically insulating the side of the upper arm 2 from the side of the lower arm 3.

On the side of the upper arm 2, specifically, a gate driver PWM signal SU1, as outputted from the CPU 4, is inputted through the air-core type insulated transformer TU1 to the gate driver IC 8 with the protecting function. An alarm signal SU2, as outputted from the gate driver IC 8 with the protecting function, is inputted to the CPU 4 through the air-core type insulated transformer TU2. An IGBT chip temperature PWM signal SU3, as outputted from the analog PWM converter CU, is inputted to the CPU 4 through the air-core type insulated transformer TU3.

On the side of the lower arm 3, a gate driver PWM signal SD1, as outputted from the CPU 4, is inputted through the air-core type insulated transformer TD1 to the gate driver IC 7 with the protecting function. An alarm signal SD2, as outputted from the gate driver IC 7 with the protecting function, is inputted to the CPU 4 through the air-core type insulated transformer TD2. An IGBT chip temperature PWM signal SD3, as outputted from the analog PWM converter CD, is inputted to the CPU 4 through the air-core type insulated transformer TD3.

Each of the air-core insulated transformers TU1 to TU3 and TD1 to TD3 is equipped with a sending-side primary winding and a receiving-side secondary winding. The primary windings and the secondary windings of the air-core type insulated transformers TU1 to TU3 and TD1 to TD3 are constituted to face each other. For example, the primary windings and the secondary windings of the air-core type insulated transformers TU1 to TU3 and TD1 to TD3 can be mutually laminated through insulating layers. The air-core type insulated transformers TU1 to TU3 and TD1 to TD3 can be formed by a fine working technique such as a semiconductor process technique.

The insulating layers for insulating and separating the primary windings from the secondary windings of the air-core type insulated transformers TU1 to TU3 and TD1 to TD3 can be exemplified by glass substrates or ceramic substrates. The thickness of the glass substrate or the ceramic substrate can be set to retain an ESD withstand of 15 to 30 kV so that it can be set at about several tens μm to several hundreds μm, for example. In a case where a glass substrate is used as the insulating layer for insulating and separating the primary windings from the secondary windings of the air-core type insulated transformers TU1 to TU3 and TD1 to TD3, it is preferred that the material for the glass substrate is a non-alkaline component. The ceramic substrate for insulating and separating the primary windings from the secondary windings of the air-core type insulated transformers TU1 to TU3 and TD1 to TD3 can be made of Alumina, Zirconia Or Aluminum Nitride, for example.

The CPU 4 generates the gate driving PWM signals SD1 and SU1 for controlling turning the IGBTs 5 and 60N and OFF, and insulates and transmits the gate driving PWM signals SD1 and SU1 to the gate driver ICs 7 and 8, respectively, through the air-core type insulated transformers TD1 and TU1. On the basis of the gate driving PWM signals SD1 and SU1, the gate driver ICs 7 and 8 generate the gate signals SD4 and SU4, to drive the control terminals of the IGBTs 5 and 6 thereby to cause the IGBTs 5 and 6 to perform the switching actions.

The overheating detecting signals SD6 and SU6, as outputted from the temperature sensor, are inputted to the gate driver ICs 7 and 8 with the protecting function, respectively, and the overcurrent detecting signals SD5 and SU5, as outputted from the current sensor, are inputted to the gate driver ICs 7 and 8 with the protecting function, respectively. The gate driver ICs 7 and 8 with the protecting function transmit, in case they exceed the threshold value, at which the IGBTs 5 and 6 are not turned off, the alarm signals SD2 and SU2 to the CPU 4 through the air-core type insulated transformers TD2 and TU2, respectively. The CPU 4 stops generating the gate driving PWM signals SD1 and SU1 when it receives the alarm signals SD2 and SU2 from the gate driver ICs 7 and 8 with the protecting function, respectively, thereby shutting off the electric currents flowing through the IGBTs 5 and 6.

The gate driver ICs 7 and 8 with the protecting function release the alarm signals SD2 and SU2 after a constant time period has elapsed, when it is decided on the basis of the overheating detection signals SD6 and SU6 outputted from the temperature sensor and the overcurrent detecting signal SD5 and SU5 outputted from the current sensor that the gate driver ICs 7 and 8 fall under the threshold value, at which the IGBTs 5 and 6 are not turned off. In the case of performing fine monitoring, the overheating detection signals SD6 and SU6, as outputted from the temperature sensor, are inputted to the analog PWM converters CD and CU, respectively. The analog PWM converters CD and CU convert the analog values of the overheating detection signals SD6 and SU6, respectively, into digital signals to generate the IGBT chip temperature PWM signals SD3 and SU3, respectively, and transmit the IGBT chip temperature PWM signals SD3 and SU3 to the CPU 4 through the air-core type insulated transformers TD3 and TU3, respectively. The CPU 4 calculates the chip temperatures of the IGBTs 5 and 6 from the IGBT chip temperature PWM signals SD3 and SU3, respectively, so that it can lower the switching frequencies of the IGBTs 5 and 6 stepwise or can stop the switching, in accordance with the threshold values of predetermined several steps.

The air-core type insulated transformers TU1 to TU3 and TD1 to TD3 are so formed by the fine working technique that their primary winding and secondary winding may face each other. This makes it possible to reduce the winding diameters of the primary winding and the secondary winding and to shorten the spacing between the primary winding and the secondary winding. As a result, the area for the magnetic flux to interlink with the primary winding and the secondary winding, while enhancing the coupling coefficient between the primary winding and the secondary winding, and the influence of the noise due to the external magnetic flux can be reduced. The transfer of the signals is made while insulating the low-voltage side from the high-voltage side, so that no photocoupler need be used to improve the environmental resistance while suppressing deterioration due to age.

The insulating layer for insulating and separating the primary winding from the secondary winding of the air-core type insulated transformers TU1 to TU3 and TD1 to TD3 is exemplified by a glass substrate or a ceramic substrate. As a result, the spacing between the primary winding and the secondary winding of the air-core type insulated transformers TU1 to TU3 and TD1 to TD3 can be retained at several tens μm or more, without causing any deterioration in the flatness or homogeneity of the surface to be formed with the primary winding and the secondary winding. As a result, the ESD withstand of 15 to 30 kV can be retained while enabling the air-core type insulated transformers TU1 to TU3 and TD1 to TD3 to be made fine by the fine working technique. The influence of noise due to the external magnetic flux can be reduced while improving reliability and environmental resistance, and the signals can be transferred while insulating the control circuit 1, and the upper arm 2 and the lower arm 3 electrically.

Figure 2:
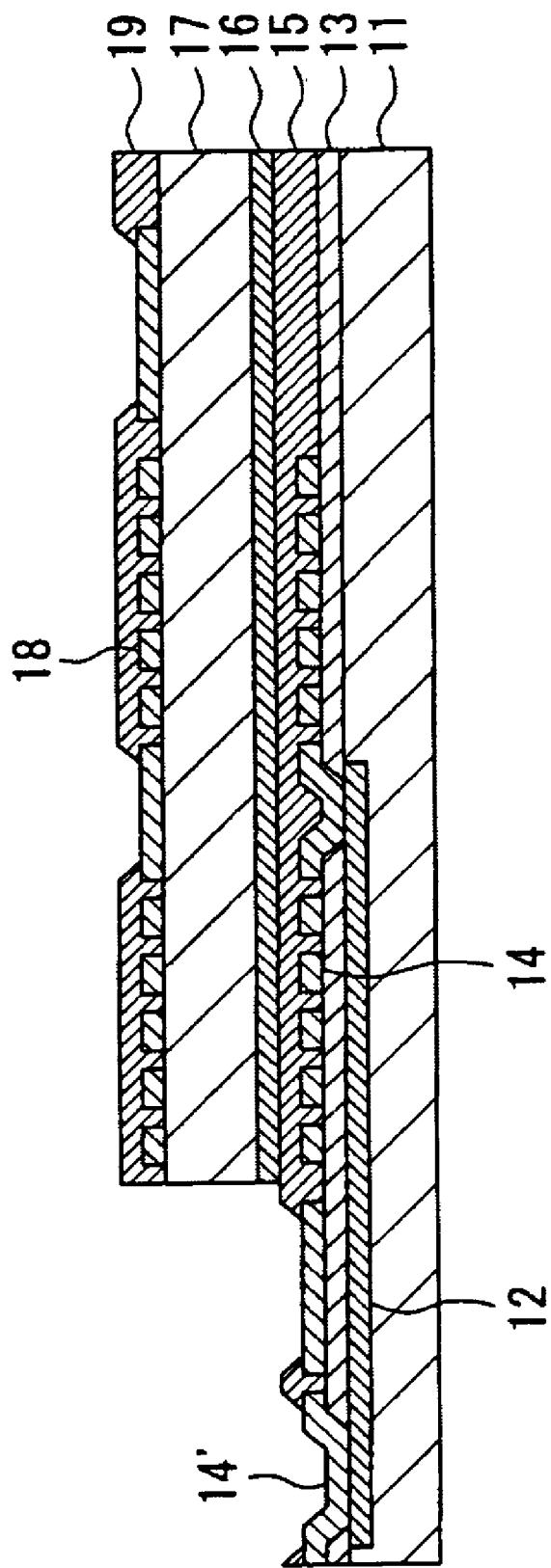
FIG. 2 is a sectional view showing an insulated transformer according to a first embodiment of the invention.

FIG. 2 is a sectional view showing a schematic constitution of the insulated transformer according to a first embodiment of the invention. In FIG. 2, an outgoing wiring layer 12 is buried in a semiconductor substrate 11, and a secondary coil pattern 14 and a wiring pattern 14' are formed over the semiconductor substrate 11 through an insulating layer 13. The integrated circuit of FIG. 1 having the gate driver ICs 7 and 8 with the protecting function, the analog PWM converters CU and CD and so on, or the switching elements SWU and SWD, may be formed on the semiconductor substrate 11. The material for the semiconductor substrate 11 can be selected from Si, Ge, SiGe, SiC, SiSn, PbS, GaAs, InP, GaP, GaN or ZnSe. The end portion, as arranged at the center portion, of the secondary coil pattern 14 is connected with the wiring pattern 14' through the outgoing wiring layer 12. A secondary side protecting film 15 is formed over the secondary coil pattern 14.

On one face over a glass substrate 17, there is formed a primary coil pattern 18, which is covered with a protecting film 19. An opening is formed in this protecting film 19, through which the starting end and the terminal end of the primary coil pattern 18 are exposed to the outside. The bonding wire can be led out from the primary coil pattern 18 by connecting it with the leading end and the trailing end of the primary coil pattern 18 through the opening.

The secondary coil pattern 14 and the primary coil pattern 18 can have a winding width of 5 to 10 μm, a thickness of 4 to 5 μm and the outermost winding diameter of 500 μm, for example. The glass substrate 17 having the primary coil pattern 18 formed on one of its face is fixed on the semiconductor substrate 11 by an adhesive layer 16 through the other face of the glass substrate 17. The adhesive layer 16 can be exemplified by an adhesive film of an epoxy resin.

As a result, without causing any deterioration in the flatness or homogeneity of the surface to be formed with the secondary coil pattern 14 and the primary coil pattern 18, the spacing between the secondary coil pattern 14 and the primary coil pattern 18 can be retained at several tens μm or more, and the secondary coil pattern 14 and the primary coil pattern 18 can be formed by a semiconductor process technique. As a result, while the spacing between the secondary coil pattern 14 and the primary coil pattern 18 is retained at several tens μm or more, the insulated transformers can be integrated over the semiconductor substrate 11, so that the signal transmission circuit can be reduced in size, while retaining the ESD withstand of 15 to 30 kV. In the aforementioned embodiment, a description has been made of a method in which the secondary coil pattern 14 is formed on the semiconductor substrate 11 and in which the primary coil pattern 18 is formed on the glass substrate 17. Alternatively, the secondary coil pattern 14 may be formed on the glass substrate 17, and the primary coil pattern 18 may be formed on the semiconductor substrate 11, without departing from the scope of the invention.

FIG. 3 and FIG. 4 present sectional views showing methods for manufacturing the insulated transformer of FIG. 2. In FIG. 3A, an impurity such as As, P or B is selectively injected into the semiconductor substrate 11, thereby forming such an outgoing wiring layer 12 in the semiconductor substrate 11 as is let out from the center of the secondary coil pattern 14. Next, the insulating layer 13 is formed by the plasma CVD method or the like on the semiconductor substrate 11 having the outgoing wiring layer 12 formed therein, as shown in FIG. 3B. The material for the insulating layer 13 can be exemplified by a silicon oxide film or a silicon nitride film.

Figure 3A:
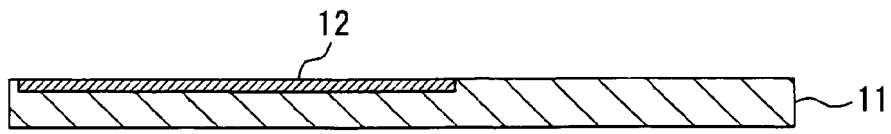
FIG. 3 presents sectional views showing a method for manufacturing the insulated transformer of FIG. 2.
Figure 3B:
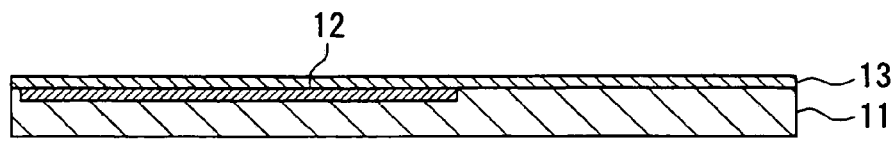
Figure 3C:
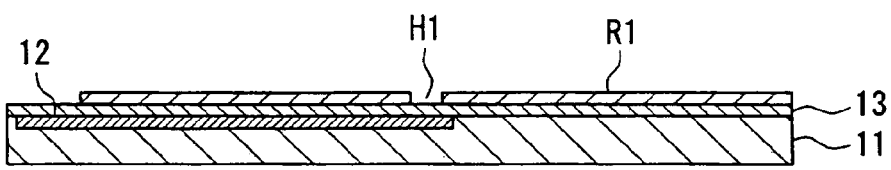
Figure 3D:
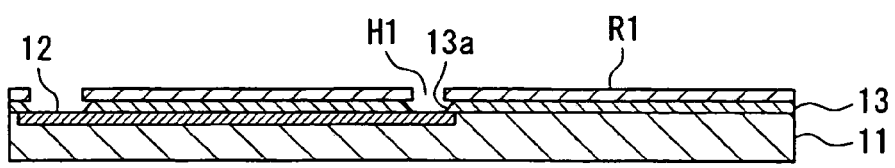
Figure 3E:
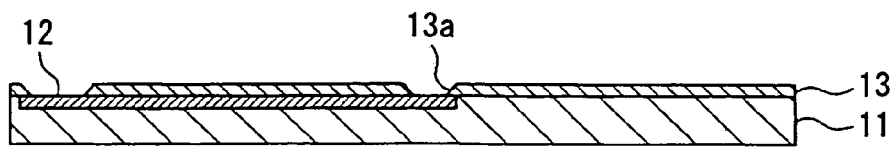

Next, as shown in FIG. 3C, a resist pattern R1, which has an opening H1 formed to correspond to the connecting portion between the outgoing portion from the center of the secondary coil pattern 14 and the wiring pattern 14', is formed over the insulating layer 13 by using the photolithography technique. Next, as shown in FIG. 3D, the insulating layer 13 is etched by using the resist pattern R1 having the opening H1 as the mask, thereby forming such an opening 13a in the insulating layer 13 as to correspond to the connecting portion between the outgoing portion from the center of the secondary coil pattern 14 and the wiring pattern 14'. Next, as shown in FIG. 3E, the resist pattern R1 is peeled off from the insulating layer 13 by means of chemicals.

Figure 3F:
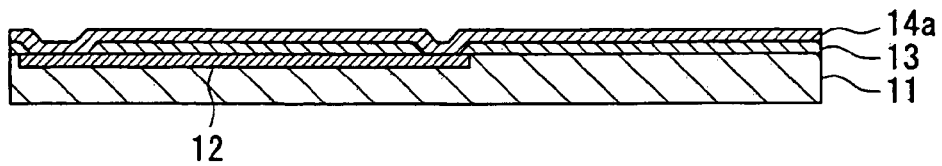
Figure 3G:
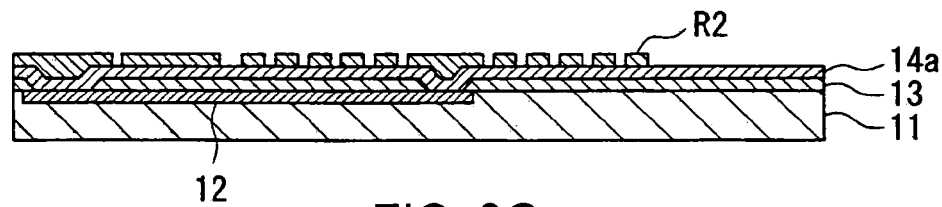
Figure 3H:
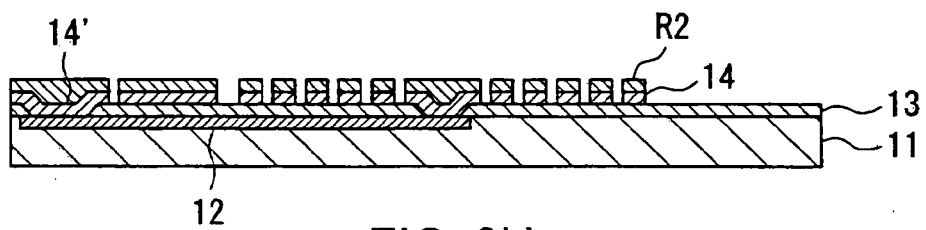
Figure 3I:
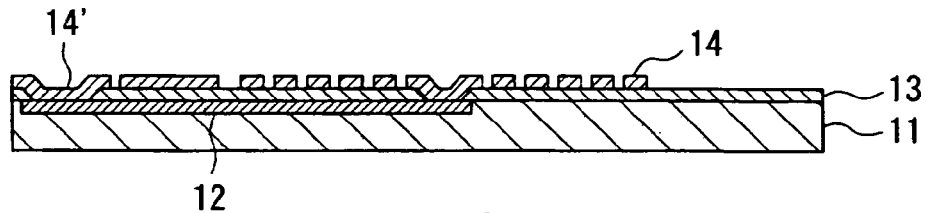

Next, as shown in FIG. 3F, a conductive film 14a is formed over the insulating layer 13 by a sputtering or vapor deposition method. The material for the conductive film 14a can be exemplified by a metal such as Al or Cu. Next, as shown in FIG. 3G, a resist pattern R2 corresponding to the secondary coil pattern 14 is formed over the conductive film 14a by using the photolithography technique. Next, as shown in FIG. 3H, the secondary coil pattern 14 is formed over the insulating layer 13 by etching the conductive film 14a, using the resist pattern R2 as a mask. Next, as shown in FIG. 3I, the resist pattern R2 is peeled off from the secondary coil pattern 14 by means of chemicals.

Figure 3J:
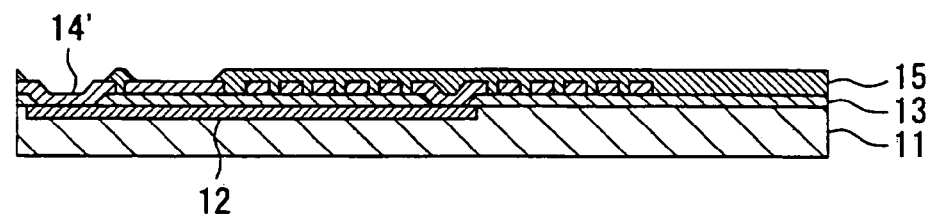

Next, as shown in FIG. 3J, the protecting film 15 is formed by the plasma CVD method or the like over the insulating layer 13 having the secondary coil pattern 14. The material for the protecting film 15 can be exemplified by silicon oxide film or silicon nitride film. By using the photolithography technique and the etching technique, the opening corresponding to the outgoing portions of the leading end and the trailing end of the secondary coil pattern 14 is formed in the protecting film 15.

Figure 4A:
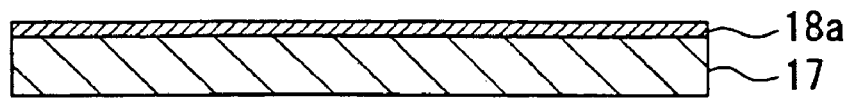
FIG. 4 presents sectional views showing a method for manufacturing the insulated transformer of FIG. 2.
Figure 4B:
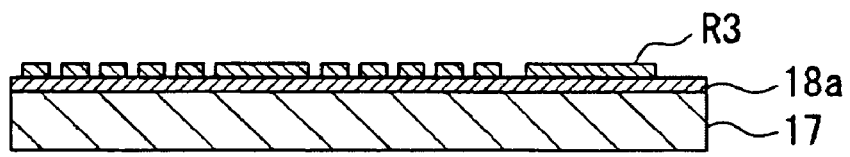
Figure 4C:
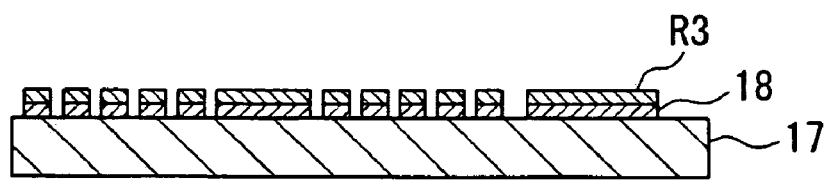
Figure 4D:

As shown in FIG. 4A, a conductive film 18a is formed over the glass substrate 17 by the sputtering or vapor deposition method. The material for the conductive film 18a can be exemplified by the metal such as Al or Cu. Next, as shown in FIG. 4B, a resist pattern R3 corresponding to the primary coil pattern 18 is formed over the conductive film 18a by using the photolithography technique. Next, as shown in FIG. 4C, the primary coil pattern 18 is formed over the glass substrate 17 by etching the conductive film 18a, using the resist pattern R3 as a mask. Next, as shown in FIG. 4D, the resist pattern R3 is peeled off from the primary coil pattern 18 by means of chemicals.

Figure 4E:
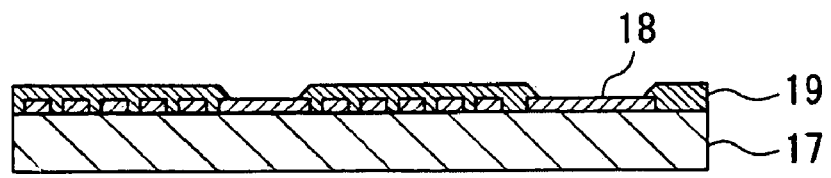

Next, as shown in FIG. 4E, the protecting film 19 is formed by the plasma CVD method or the like over the glass substrate 17 having the primary coil pattern 18. The material for the protecting film 19 can be exemplified by the silicon oxide film or the silicon nitride film. By using the photolithography technique and the etching technique, the opening corresponding to the outgoing portions of the leading end and the trailing end of the primary coil pattern 18 is formed in the protecting film 19.

Figure 4F:
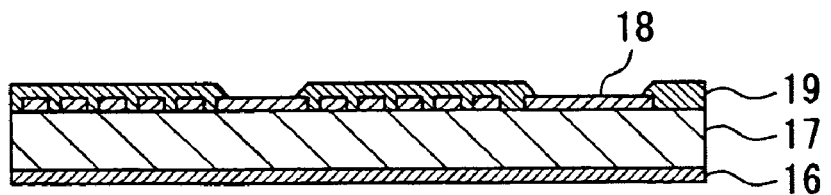
Figure 4G:
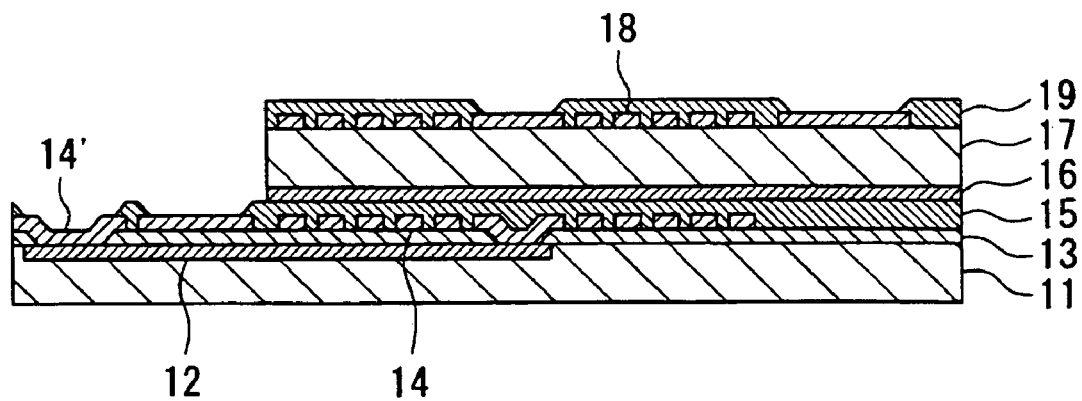

Next, as shown in FIG. 4F, adhesive tape 16 is applied to a face of the glass substrate 17 having another face on which the primary coil pattern 18 is formed, and the glass substrate 17 is then formed into a chip. Next, as shown in FIG. 4G, the glass substrate 17 having the primary coil pattern 18 formed on one face is so fixed over the semiconductor substrate 11 by the adhesive tape 16 that the secondary coil pattern 14 and the primary coil pattern 18 are arranged to face each other.

Figure 5:
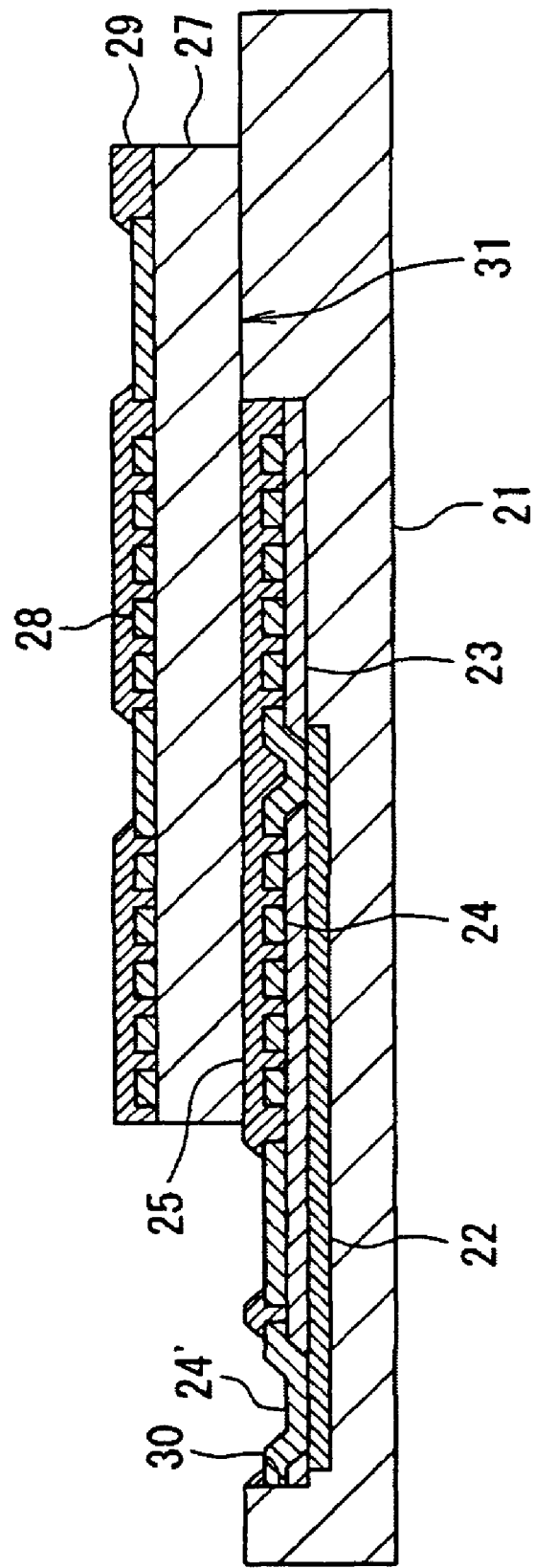
FIG. 5 is a sectional view of an insulated transformer according to a second embodiment of the invention.

FIG. 5 is a sectional view of an insulated transformer according to a second embodiment of the invention. In FIG. 5, a recess 30 is formed in a semiconductor substrate 21. An outgoing wiring layer 22 is so buried in a semiconductor substrate 21 that it may be arranged in that recess 30, and a secondary coil pattern 24 and a wiring pattern 24' are formed over the semiconductor substrate 21 through an insulating layer 23. The integrated circuit of FIG. 1 having the gate driver ICs 7 and 8 with the protecting function, the analog PWM converters CU and CD and so on, or the switching elements SWU and SWD may be formed on the semiconductor substrate 21. The end portion, as arranged at the center portion, of the secondary coil pattern 24 is connected with the wiring pattern 24' through the outgoing wiring layer 22. A secondary side protecting film 25 is formed over the secondary coil pattern 24.

A primary coil pattern 28, which is covered with a protecting film 29, is formed on one face over a glass substrate 27. In this protecting film 29, there is formed an opening, through which the starting end and the terminal end of the primary coil pattern 28 are exposed to the outside. The bonding wire can be led out from the primary coil pattern 28 by connecting it with the leading end and the trailing end of the primary coil pattern 28 through the opening.

The glass substrate 27 having the primary coil pattern 28 formed on its face is fixed by an electrostatic junction to a junction face 31 of the semiconductor substrate 21 through the other face of the glass substrate 27. The aforementioned embodiment has described a method in which the secondary coil pattern 24 is formed on the semiconductor substrate 21 and in which the primary coil pattern 28 is formed on the glass substrate 27. However, the secondary coil pattern 24 may also be formed on the glass substrate 27, and the primary coil pattern 28 may also be formed on the semiconductor substrate 21.

FIG. 6 and FIG. 7 present sectional views showing methods for manufacturing the insulated transformer of FIG. 5. By using the photolithography technique, as shown in FIG. 6A, a resist pattern R11, which has an opening H11 formed corresponding to the recess 30 for arranging the secondary coil pattern 24, is formed over the semiconductor substrate 21. Next, as shown in FIG. 6B, the semiconductor substrate 21 is etched by using the resist pattern R11 having the opening H11 as a mask, thereby forming the recess 30 for arranging the secondary coil pattern 24, in the semiconductor substrate 21.

Figure 6A:
FIG. 6 presents sectional views showing a method for manufacturing the insulated transformer of FIG. 5.
Figure 6B:
Figure 6C:
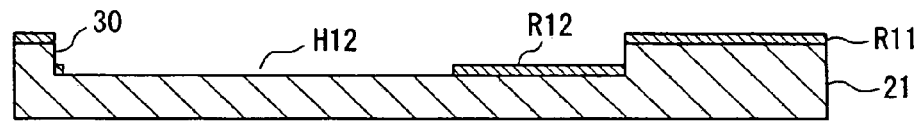
Figure 6D:
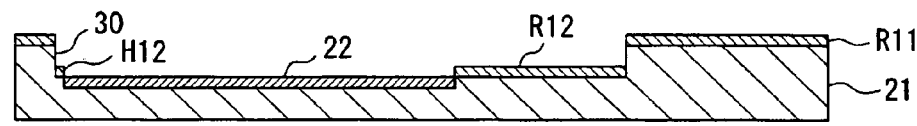
Figure 6E:
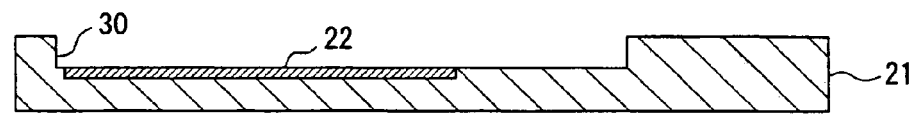

Next, as shown in FIG. 6C, a resist pattern R12 having an opening H12 formed to correspond to the outgoing wiring layer 22 is formed in the recess 30 by using the photolithography technique. Next, as shown in FIG. 6D, by injecting an impurity such as As, P or B selectively into the semiconductor substrate 21 while using the resist pattern R12 having the opening H12 as a mask, the outgoing wiring layer 22, which is to be led out from the center of the secondary coil pattern 24, is formed in the semiconductor substrate 21. Next, as shown in FIG. 6E, the resist patterns R11 and R12 are peeled off from the semiconductor substrate 21 by means of chemicals. Embodiments using the photolithography technique are explained here. However, other methods of fine working, such as X-ray lithography, electron-beam lithography and ion beam lithography techniques are also applicable to the invention.

Figure 6F:
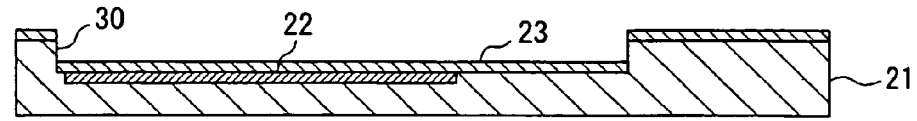
Figure 6G:
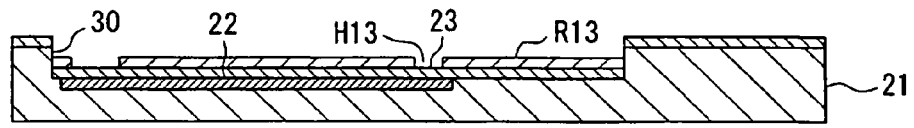

Next, as shown in FIG. 6F, the insulating layer 23 is formed by the plasma CVD method or the like over the semiconductor substrate 21 having the outgoing wiring layer 22. The material for the insulating layer 23 can be exemplified by the silicon oxide film or the silicon nitride film. Next, as shown in FIG. 6G, a resist pattern R13 having an opening H13 formed to correspond to the connecting portion between the outgoing portion from the center of the secondary coil pattern 24 and the wiring pattern 24' is formed over the insulating layer 23 by using the photolithography technique.

Figure 6H:
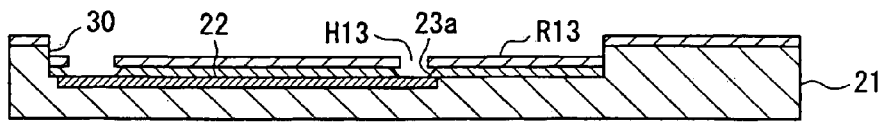
Figure 6I:
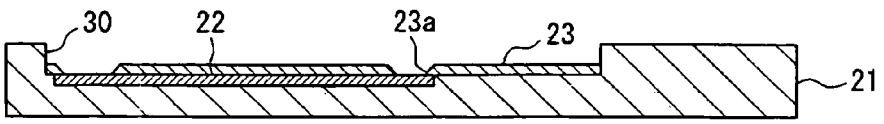
Figure 6J:
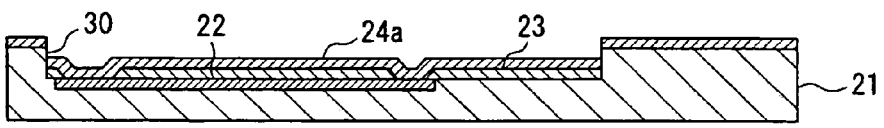

Next, as shown in FIG. 6H, the insulating layer 23 is etched by using the resist pattern R13 having the opening H13 as the mask, thereby forming such an opening 23a in the insulating layer 23 as corresponds to the connecting portion between the outgoing portion from the center of the secondary coil pattern 24 and the wiring pattern 24'. Next, as shown in FIG. 6I, the resist pattern R13 is peeled off from the insulating layer 23 by means of chemicals. Then, as shown in FIG. 6J, a conductive film 24a is formed over the insulating layer 23 by the sputtering or vapor deposition method. The material for the conductive film 24a can be exemplified by the metal such as Al or Cu.

Figure 6K:
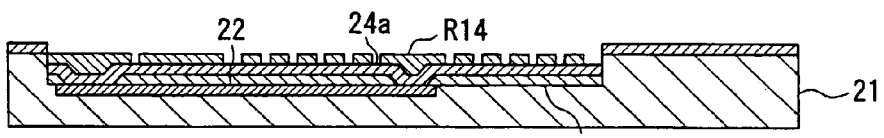
Figure 6L:
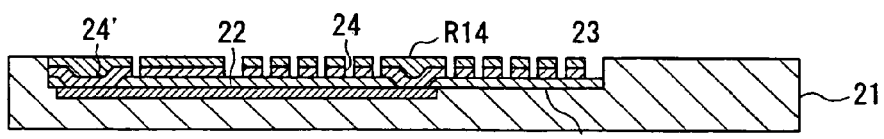
Figure 6M:
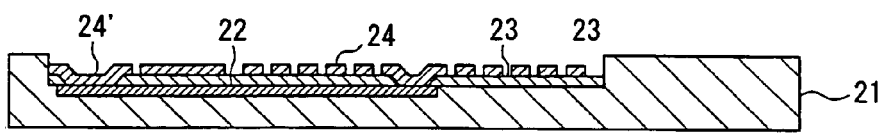

Next, as shown in FIG. 6K, a resist pattern R14 corresponding to the secondary coil pattern 24 is formed over the conductive film 24a by using the photolithography technique. Next, as shown in FIG. 6L, the conductive film 24a is etched by using the resist pattern R14 as the mask, thereby forming the secondary coil pattern 24 over the insulating layer 23. Next, as shown in FIG. 6M, the resist pattern R14 is peeled off from the secondary coil pattern 24 by means of chemicals.

Figure 6N:
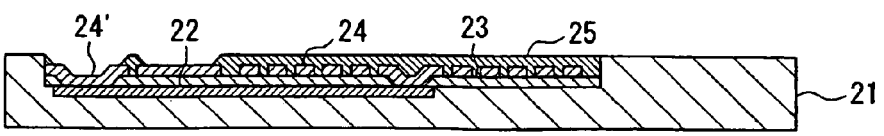

Next, as shown in FIG. 6N, the protecting film 25 is formed or the like over the insulating layer 23 having the secondary coil pattern 24 by the plasma CVD method. The protecting film 25 is buried in the recess 30 thereby to expose the surface of the semiconductor substrate 21 other than the recess 30 to the outside by flattening the protecting film 25 by a CMP method. The material for the protecting film 25 can be exemplified by silicon oxide film or silicon nitride film. By using the photolithography technique and the etching technique, the opening corresponding to the outgoing portions of the leading end and the trailing end of the secondary coil pattern 24 is formed in the protecting film 25.

Figure 7A:
FIG. 7 presents sectional views showing a method for manufacturing the insulated transformer of FIG. 5.
Figure 7B:
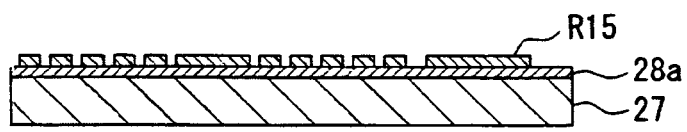
Figure 7C:
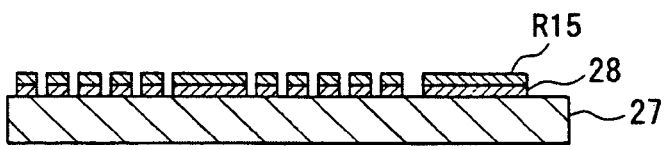
Figure 7D:

As shown in FIG. 7A, a conductive film 28a is formed over the glass substrate 27 by the sputtering or vapor deposition method. The material for the conductive film 28a can be exemplified by a metal such as Al or Cu. Next, as shown in FIG. 7B, a resist pattern R15 corresponding to the primary coil pattern 28 is formed over the conductive film 28a by using the photolithography technique. Next, as shown in FIG. 7C, the conductive film 28a is etched by using the resist pattern R15 as the mask, thereby forming the primary coil pattern 28 over the glass substrate 27. Next, as shown in FIG. 7D, the resist pattern R15 is peeled off from the primary coil pattern 28 by means of chemicals.

Figure 7E:
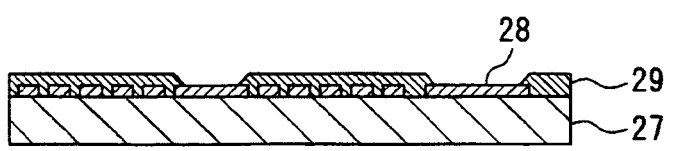

Next, as shown in FIG. 7E, the protecting film 29 is formed over the glass substrate 27 having the primary coil pattern 28 by the plasma CVD method or the like. The material for the protecting film 29 can be exemplified by silicon oxide film or silicon nitride film. By using the photolithography technique and the etching technique, the opening corresponding to the outgoing portions of the leading end and the trailing end of the primary coil pattern 28 is formed in the protecting film 29.

Figure 7F:
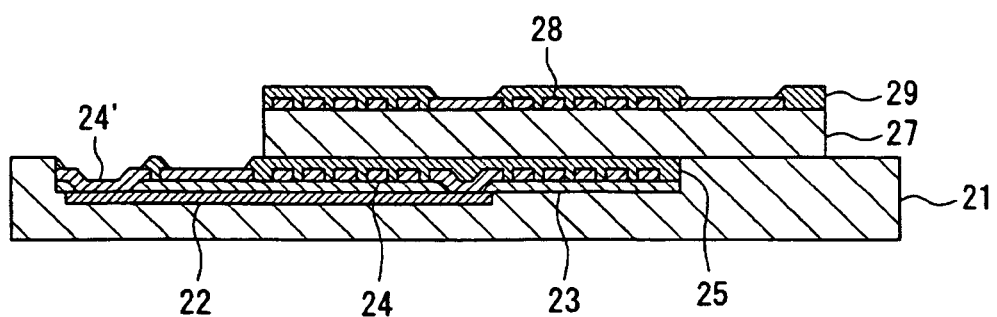

Next, as shown in FIG. 7F, the glass substrate 27 having the primary coil pattern 28 formed on one of its face is so fixed by the electrostatic junction onto the semiconductor substrate 21 that the secondary coil pattern 24 and the primary coil pattern 28 are arranged to face each other. In a case where the glass substrate 27 is fixed onto the semiconductor substrate 21 by the electrostatic junction, the glass substrate 27 and the semiconductor substrate 21 are clamped, while being heated to about 400° C., between electrostatic junction electrodes, and a negative voltage of several hundreds volts can be applied to the side of the glass substrate 27.

Figure 8:
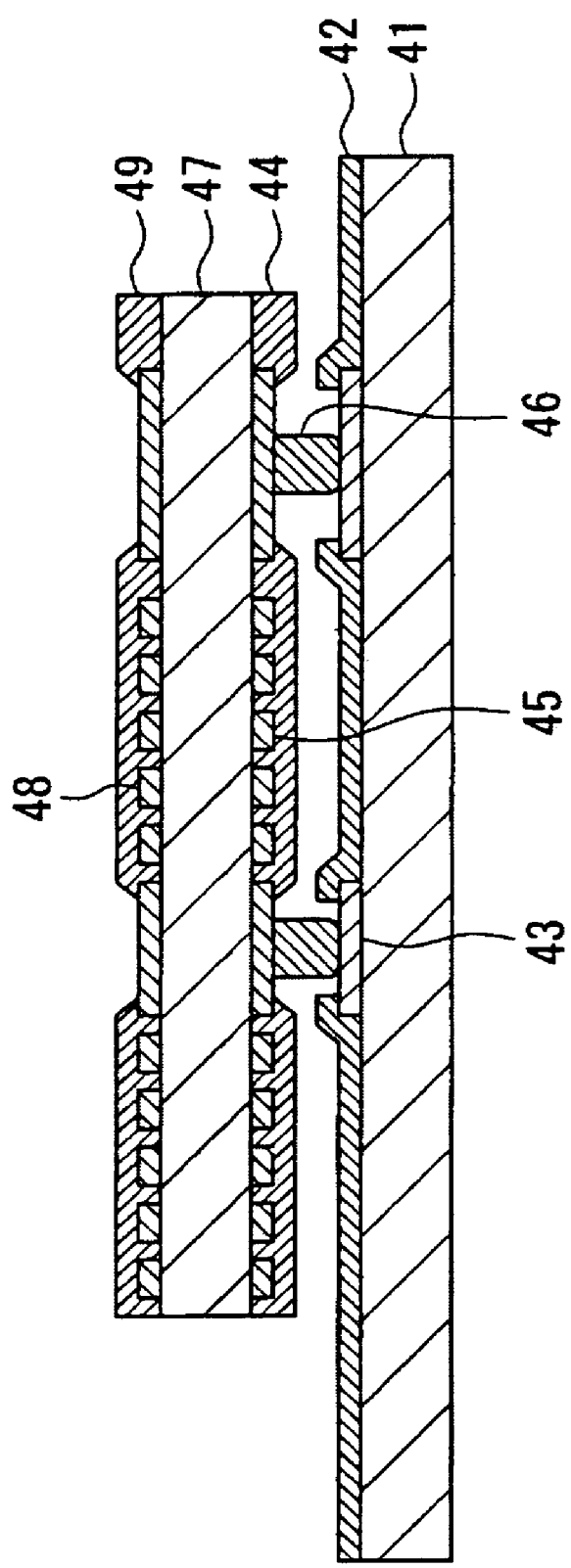
FIG. 8 is a sectional view of an insulated transformer according to a third embodiment of the invention.
Figure 9:
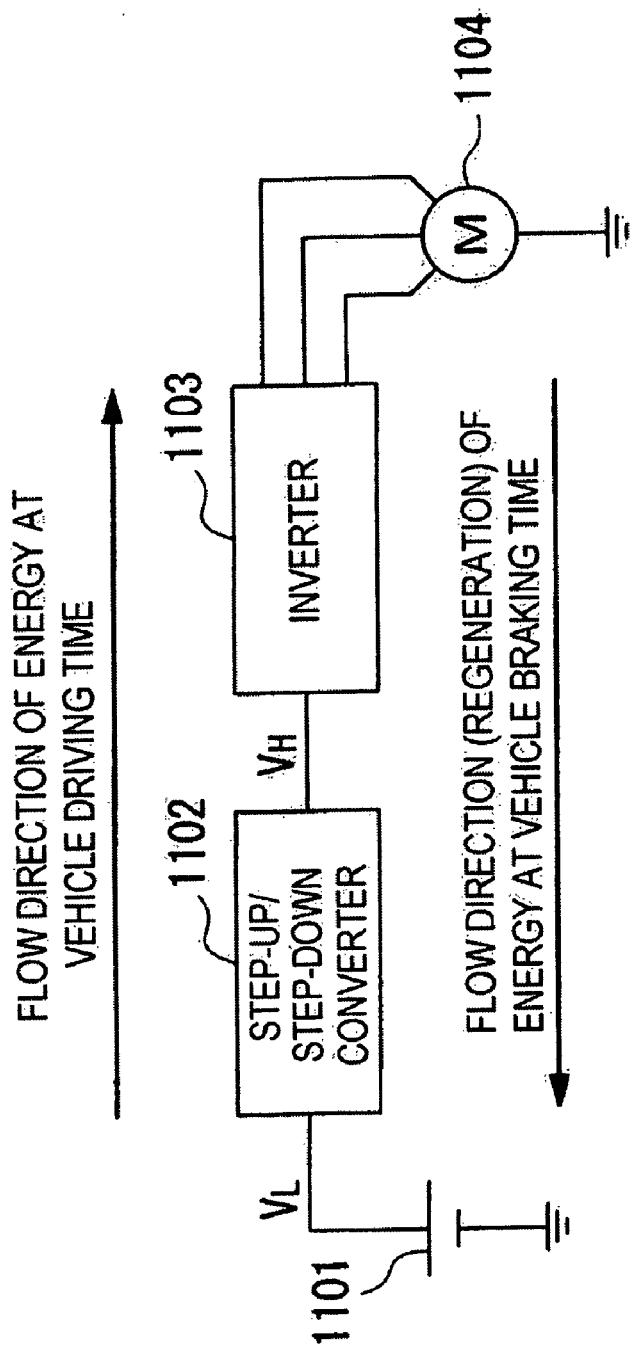
FIG. 9 is a block diagram of a vehicle driving system using a step-up/step-down converter according to the background art.
Figure 10:
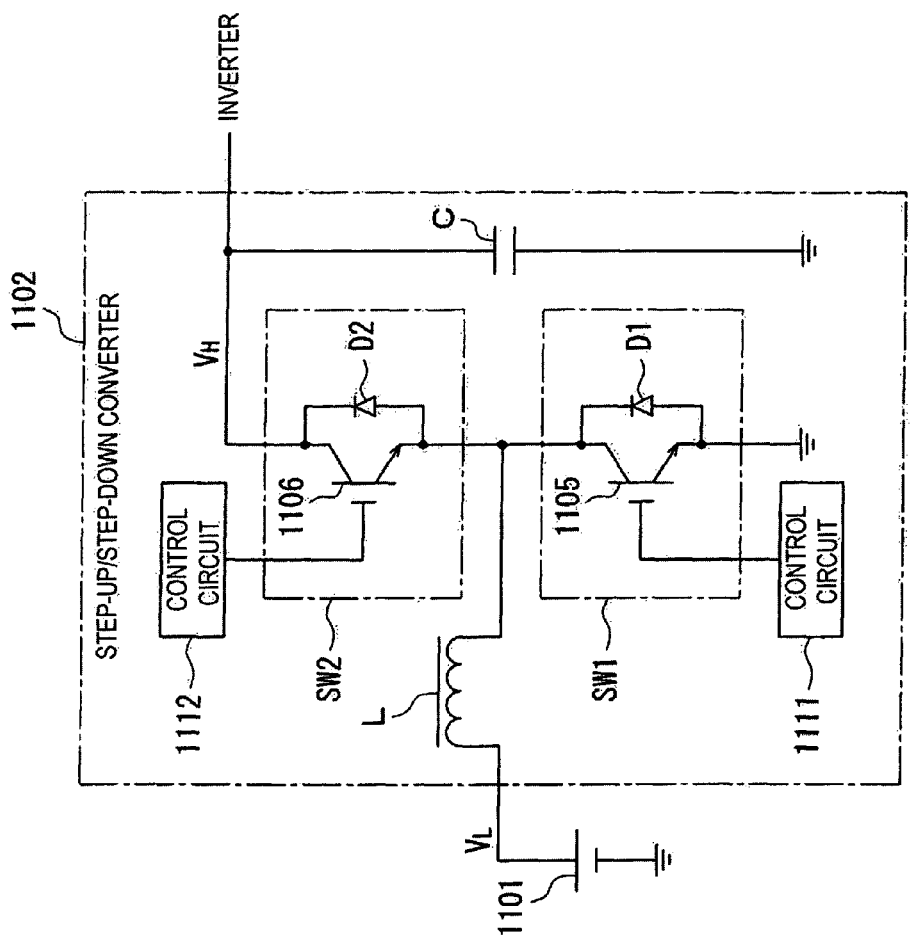
FIG. 10 is a block diagram of the step-up/step-down converter of FIG. 9.
Figure 11:
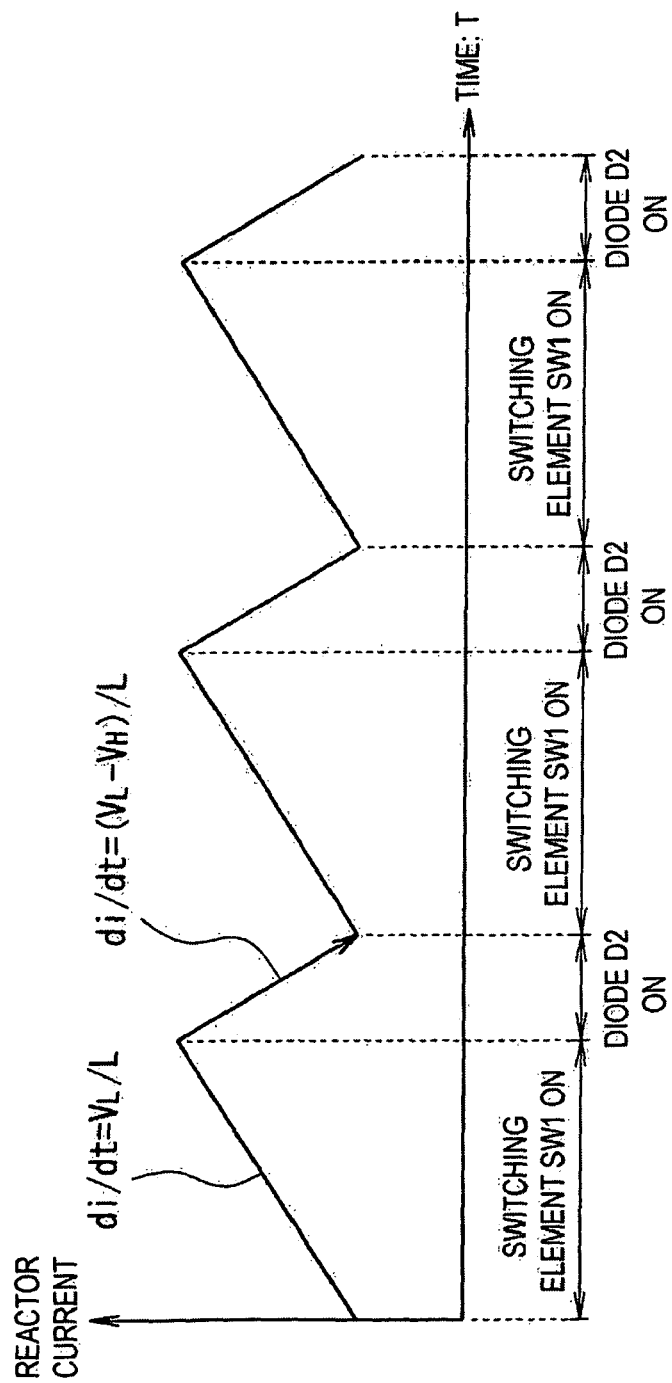
FIG. 11 is a diagram showing a waveform of an electric current flowing through the inductor of FIG. 10 in a step-up operation.
Figure 12:
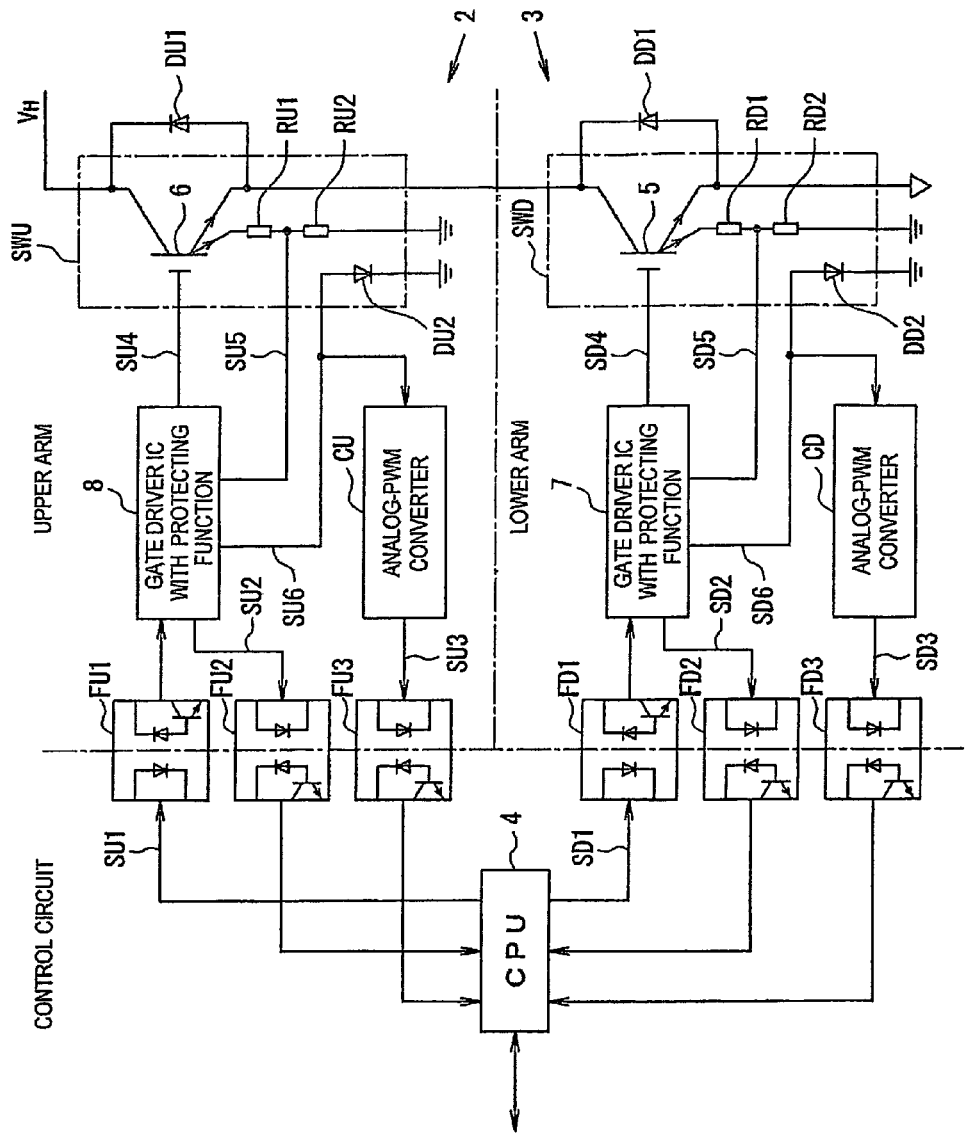
FIG. 12 is a block diagram of an intelligent power module for a step-up/step-down converter of the background art.
Figure 13:
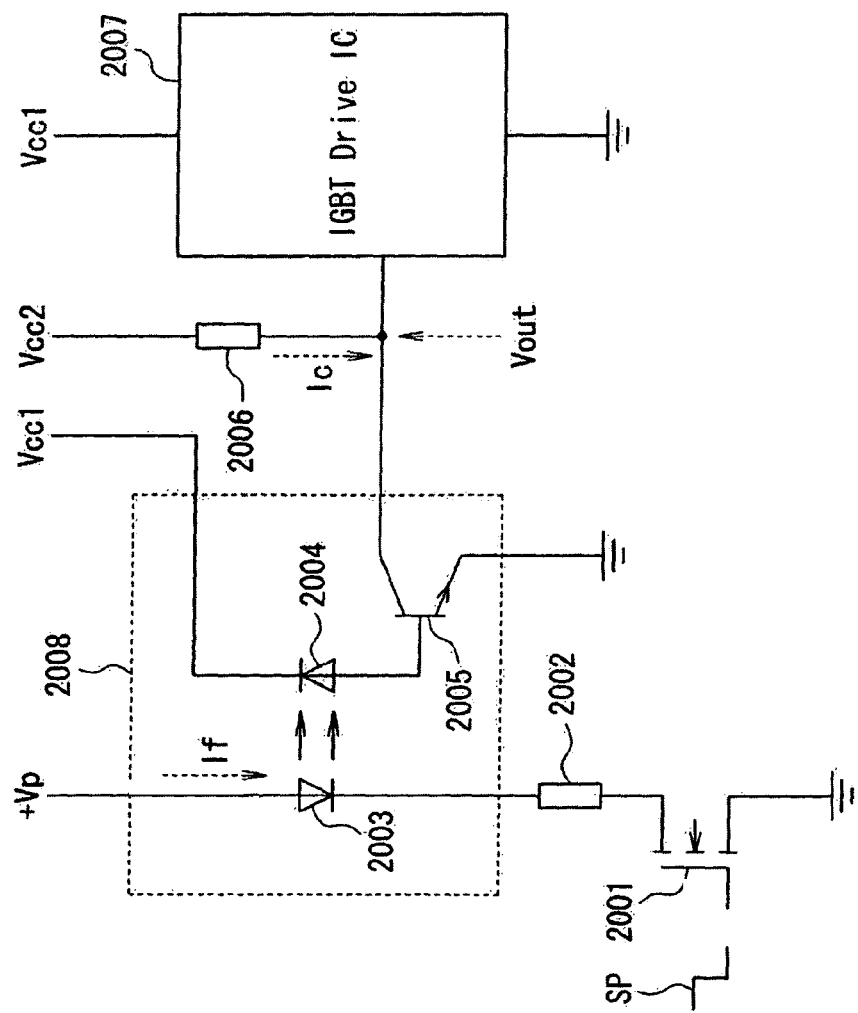
FIG. 13 is a block diagram of a peripheral circuit of a photocoupler.
Figure 14:
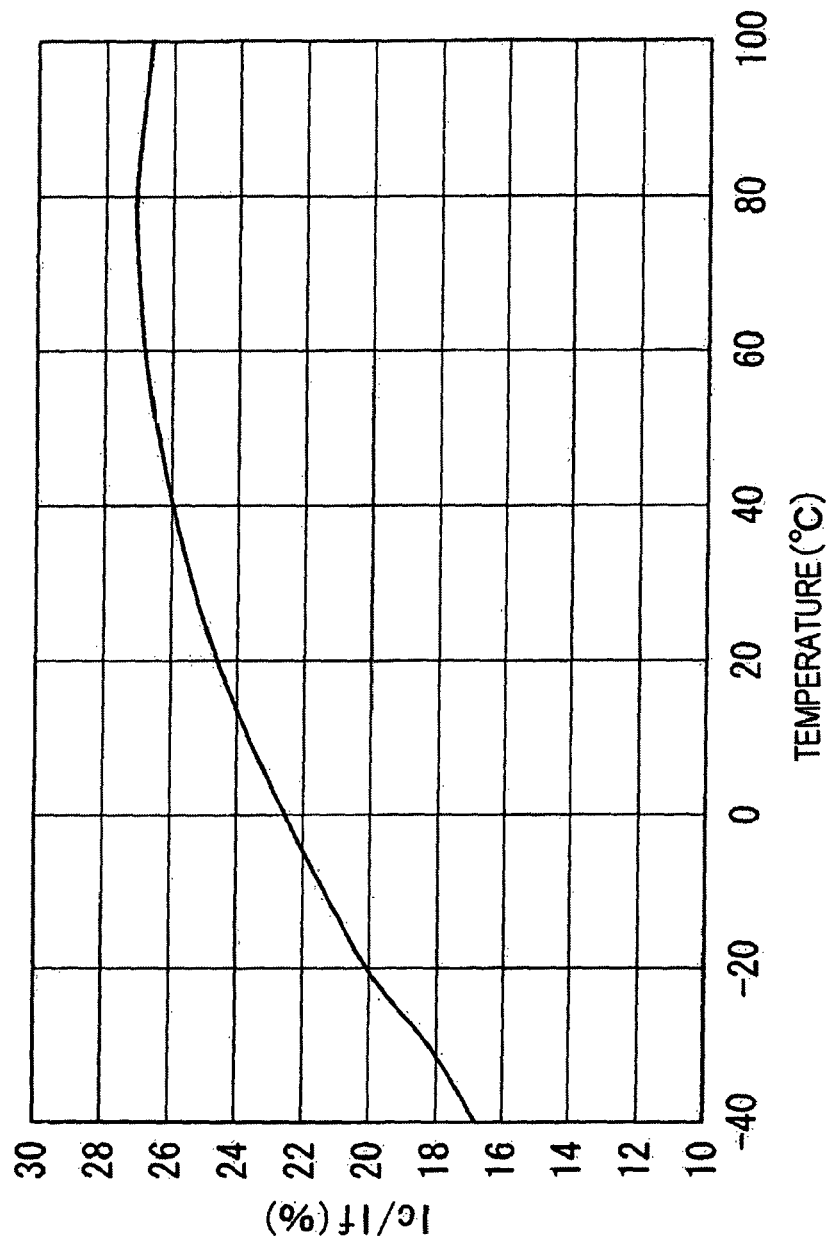
FIG. 14 is a diagram showing the temperature characteristics of the current transfer efficiency of the photocoupler.
Figure 15:
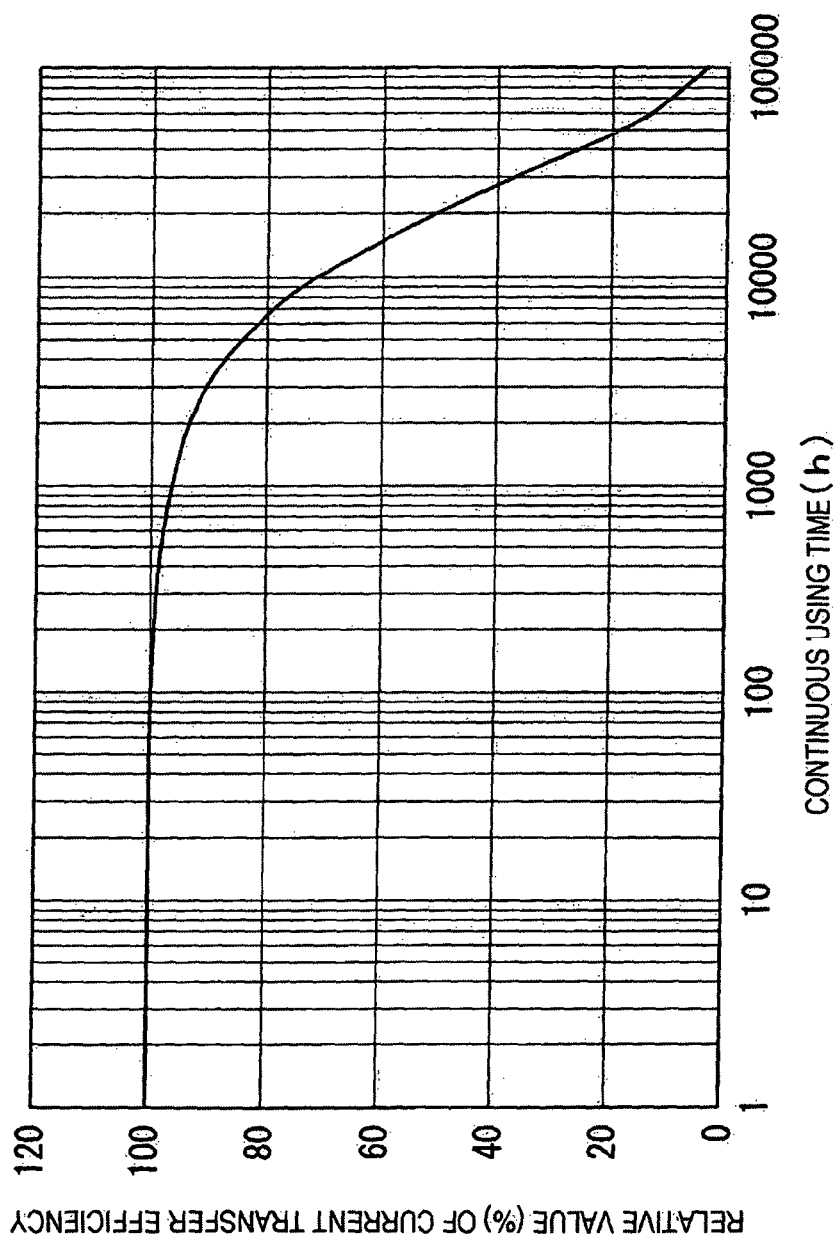
FIG. 15 is a diagram showing aging deterioration characteristics of the current transfer efficiency of the photocoupler.
Figure 16:
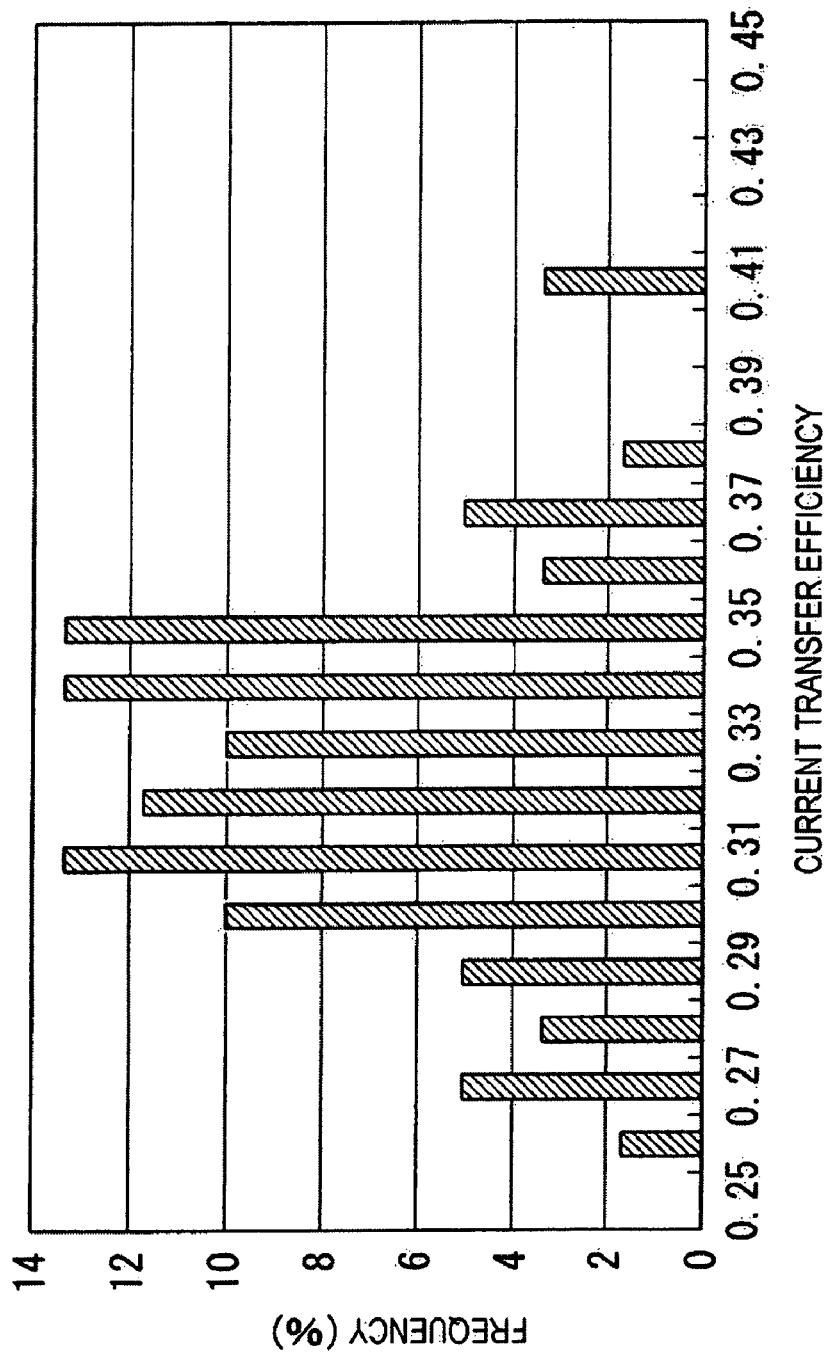
FIG. 16 is a diagram showing the dispersion of the current transfer efficiency of the photocouplet.
Figure 17A:
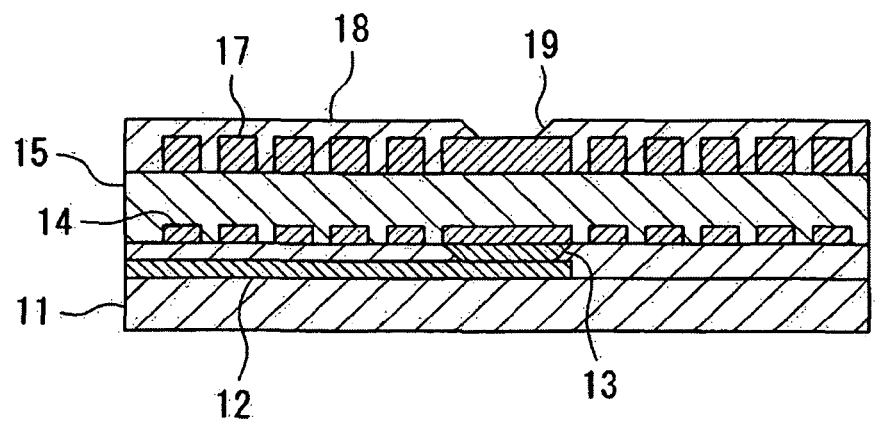
FIG. 17A is a sectional view of an insulated transformer of the background art.
Figure 17B:
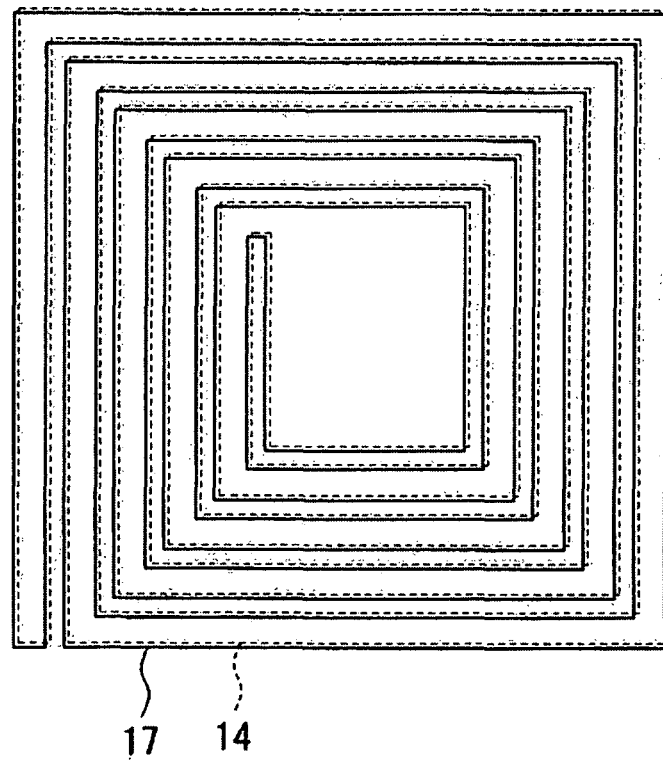
FIG. 17B is a top plan view showing the schematic constitution of the insulated transformer of FIG. 17A.
Figure 18A:
FIG. 18 is a sectional view showing an insulated transformer manufacturing method of the background art.
Figure 18B:
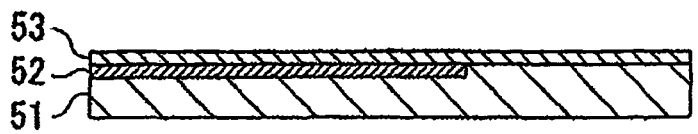
Figure 18C:
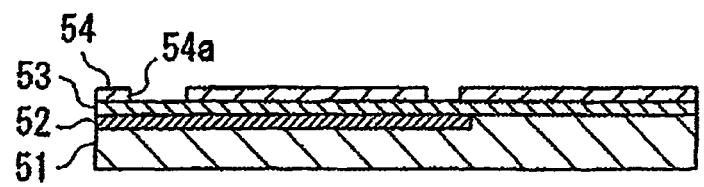
Figure 18D:
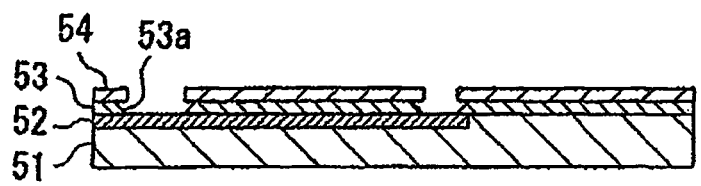
Figure 18E:
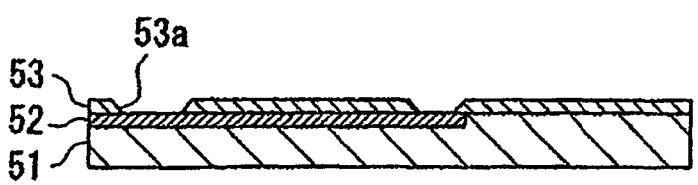
Figure 18F:
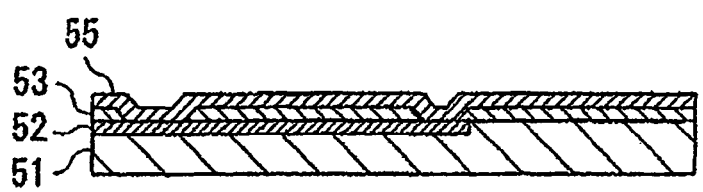
Figure 18G:
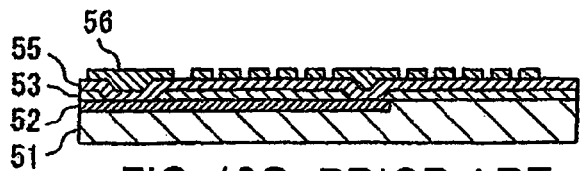
Figure 18H:
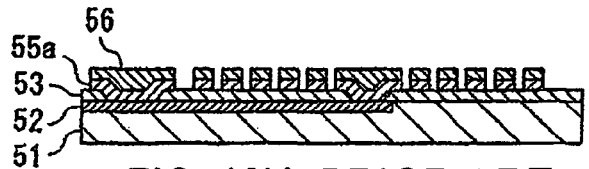
Figure 18I:
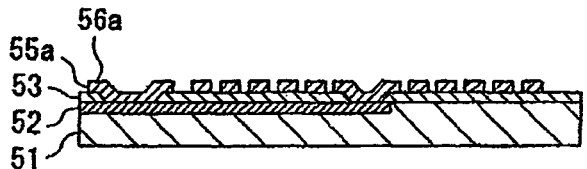
Figure 18J:
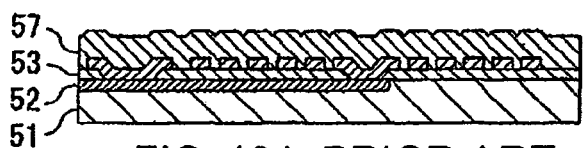
Figure 18K:
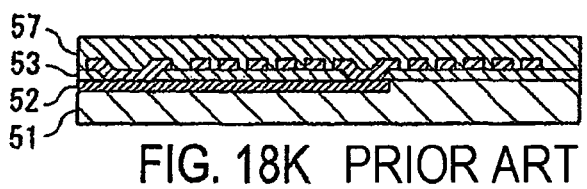
Figure 18L:
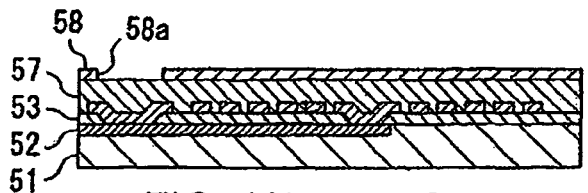
Figure 19A:
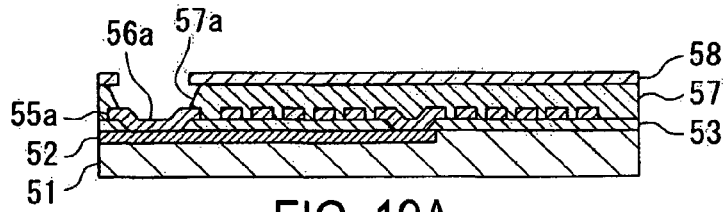
FIG. 19 is a sectional view showing an insulated transformer manufacturing method of the background art.
Figure 19B:
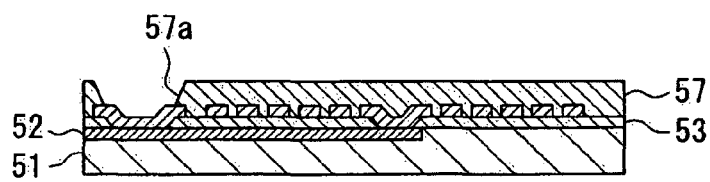
Figure 19C:
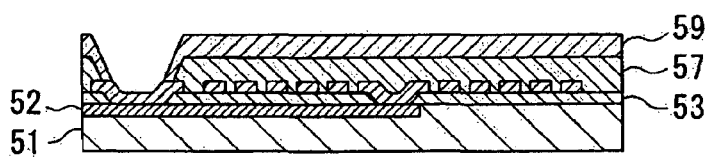
Figure 19D:
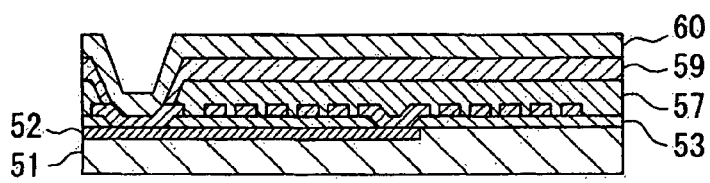
Figure 19E:
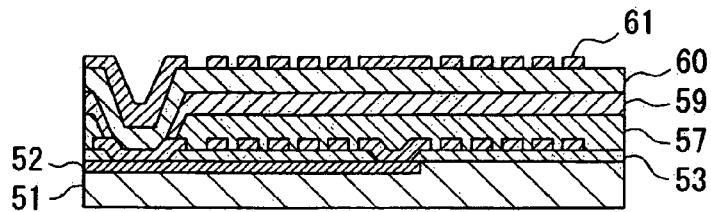
Figure 19F:
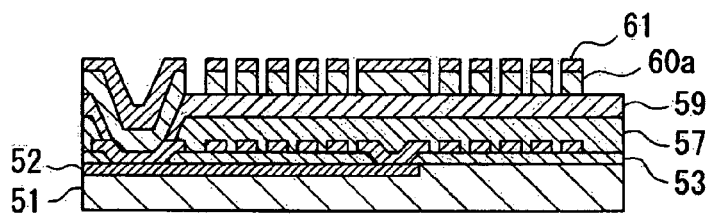
Figure 19G:
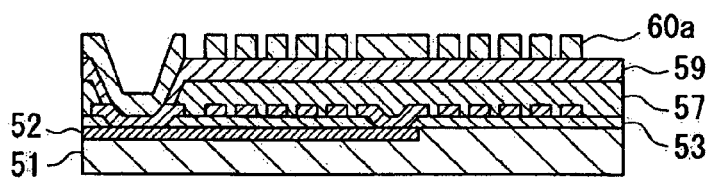
Figure 19H:
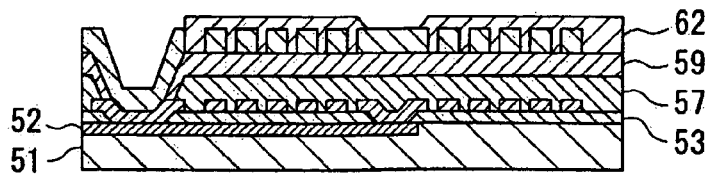

FIG. 8 is a sectional view of the insulated transformer according to a third embodiment of the invention. In FIG. 8, a wiring pattern 43 is formed on a semiconductor substrate 41. An insulating layer 42 is formed over the wiring pattern 43 to expose its connecting region with a secondary coil pattern 45 to the outside. The integrated circuit of FIG. 1 having the gate driver ICs 7 and 8 with the protecting function, the analog PWM converters CU and CD and so on, or the switching elements SWU and SWD may be formed on the semiconductor substrate 41.

A primary coil pattern 48, which is covered with a protecting film 49, is formed on one face over a glass substrate 47. In this protecting film 49, there is formed an opening, through which the starting end and the terminal end of the primary coil pattern 48 are exposed to the outside. The bonding wire can be led out from the primary coil pattern 48 by connecting it with the leading end and the trailing end of the primary coil pattern 48 through the opening.

The secondary coil pattern 45 is formed on the other face of the glass substrate 47, and the primary coil pattern 48 is covered with a protecting film 44. Moreover, this protecting film 44 has an opening formed for exposing the leading end and the trailing end of the secondary coil pattern 45 to the outside. The leading end and the trailing end of the secondary coil pattern 45 are connected with the wiring pattern 43 through a protruding electrode 46 so that the glass substrate 47 having the primary coil pattern 48 and the secondary coil pattern 45 is fixed on the semiconductor substrate 41.

The protruding electrode 46 can be exemplified not only by a solder ball or a lead-free ball but also by an Au bump or a Cu bump or a Ni bump coated with a solder material. A sealing resin may also be injected into the gap between the glass substrate 47 and the semiconductor substrate 41. In a case where the glass substrate 47 is flip-chip bonded on the semiconductor substrate 41, for example, a pressure-welding method using an ACF (Anisotropic Conductive Film), an NCF (Nonconductive Film) junction, an ACP (Anisotropic Conductive Paste) junction or an NCP (Nonconductive Paste) junction, or a metallic junction such as the solder junction or an alloy junction may be employed.

As a result, the secondary coil pattern 45 and the primary coil pattern 48 of the insulated transformer can be arranged in an overlapping manner over the circuit pattern formed on the semiconductor substrate 41 while keeping the spacing between the secondary coil pattern 45 and the primary coil pattern 48 of the insulated transformer at several tens μm or more. Further, the insulated transformer can be integrated on the semiconductor substrate 41 while reducing the space for forming the secondary coil pattern 45 and the primary coil pattern 48 of the insulated transformer on the semiconductor substrate 41, so that the signal transmission circuit can be reduced in size while retaining the ESD withstand of 15 to 30 kV.

While the present invention has been particularly shown and described with reference to preferred embodiments thereof, it will be understood by those skilled in the art that the foregoing and other changes in form and details can be made therein without departing from the spirit and scope of the present invention.

What is claimed is:

1. A power converting device comprising:
   a transformer having a primary winding and a secondary winding that face each other;
   individually acting first and second switching elements on a secondary winding side of the transformer connected in series for conducting and blocking an electric current flowing into a load;
   a control circuit connected to the primary winding and configured to generate a control signal to instruct turning said switching elements ON and OFF;
   a drive circuit connected to the secondary winding and configured to drive control terminals of the first and second switching elements on the secondary winding side of the transformer based on the control signal; and
   an insulating semiconductor substrate comprising non-alkaline glass and insulating and separating said primary winding and said secondary winding from each other such that said control circuit and said drive circuit are insulated from each other.

2. A power converting device according to claim 1, wherein the insulating substrate is configured to retain an electrostatic discharge (ESD) withstand of approximately 15 to 30 kV.

3. A power converting device according to claim 2, wherein the insulating substrate is at least a multiple of 100 μm in thickness.

* * * * *